(12) United States Patent
Jo et al.

(10) Patent No.: US 11,925,040 B2
(45) Date of Patent: Mar. 5, 2024

(54) HYBRID IMAGE SENSORS HAVING OPTICAL AND SHORT-WAVE INFRARED PIXELS INTEGRATED THEREIN

(71) Applicants: Samsung Electronics Co., Ltd., Suwon-si (KR); Seoul National University R&DB Foundation, Seoul (KR)

(72) Inventors: Seung Hyeon Jo, Seoul (KR); Taeyon Lee, Seoul (KR); Tae-Woo Lee, Seoul (KR)

(73) Assignees: Samsung Electronics Co., Ltd. (KR); Seoul National University R&DB Foundation (KR)

( * ) Notice: Subject to any disclaimer, the term of this patent is extended or adjusted under 35 U.S.C. 154(b) by 0 days.

(21) Appl. No.: 17/729,260

(22) Filed: Apr. 26, 2022

(65) Prior Publication Data
US 2023/0041006 A1 Feb. 9, 2023

(30) Foreign Application Priority Data
Aug. 5, 2021 (KR) .......................... 10-2021-0103429

(51) Int. Cl.
| | | |
|---|---|---|
| *H01L 27/146* | (2006.01) | |
| *H10K 19/20* | (2023.01) | |
| *H10K 30/30* | (2023.01) | |
| *H10K 30/82* | (2023.01) | |

(Continued)

(52) U.S. Cl.
CPC ............ *H10K 39/32* (2023.02); *H10K 19/20* (2023.02); *H10K 30/353* (2023.02); *H10K 30/82* (2023.02); *H10K 85/30* (2023.02)

(58) Field of Classification Search
CPC ...... H10K 39/32; H10K 19/20; H10K 30/353; H10K 30/82; H10K 85/30;
(Continued)

(56) References Cited

U.S. PATENT DOCUMENTS

| | | |
|---|---|---|
| 9,391,287 B1 | 7/2016 | Huang et al. |
| 10,373,997 B2 | 8/2019 | Choi et al. |

(Continued)

FOREIGN PATENT DOCUMENTS

| | | |
|---|---|---|
| JP | 2017059689 A | 3/2017 |
| JP | 6754156 B2 | 8/2020 |

(Continued)

OTHER PUBLICATIONS

Hossain et al. "Perovskite Color Detectors: Approaching the Efficiency Limit" ACS Applied Materials and Interfaces (Sep. 23, 2020).

(Continued)

*Primary Examiner* — Samuel Park
(74) *Attorney, Agent, or Firm* — Myers Bigel, P.A.

(57) ABSTRACT

An image sensor pixel includes a substrate having a pixel electrode on a light receiving surface thereof, and a photoelectric conversion layer including a perovskite material, on the pixel electrode. A transparent electrode is provided on the photoelectric conversion layer, and a vertical electrode is provided, which is electrically connected to the pixel electrode and extends at least partially through the substrate. The photoelectric conversion layer includes a perovskite layer, a first blocking layer extending between the pixel electrode and the perovskite layer, and a second blocking layer extending between the transparent electrode and the perovskite layer. The perovskite material may have a material structure of $ABX_3$, $A_2BX_4$, $A_3BX_5$, $A_4BX_6$, $ABX_4$, or $A_{n-1}B_nX_{3n+1}$, where: n is a positive integer in a range from 2 to 6; A includes at least one material selected from a group consisting of Na, K, Rb, Cs and Fr; B includes at least one material selected from a divalent transition metal, a rare earth metal, an alkaline earth metal, Ga, In, Al, Sb, Bi, and (Continued)

Po; and X includes at least one material selected from Cl, Br, and I.

19 Claims, 12 Drawing Sheets

(51) Int. Cl.
*H10K 39/32* (2023.01)
*H10K 85/30* (2023.01)

(58) Field of Classification Search
CPC ......... H01L 27/14638; H01L 27/14601; H01L 27/14621; H01L 27/14627; H01L 27/14645; H01L 27/14669; H01L 27/14609; H01L 27/14603; H01L 27/14636; H01L 27/14643; Y02E 10/549
See application file for complete search history.

(56) References Cited

U.S. PATENT DOCUMENTS

| | | | |
|---|---|---|---|
| 10,483,326 B2 | 11/2019 | Yu et al. | |
| 10,720,471 B2 | 7/2020 | Shiomi et al. | |
| 10,757,353 B2 | 8/2020 | Matsuda et al. | |
| 2018/0019363 A1* | 1/2018 | Takahashi | H01L 31/02164 |
| 2018/0211792 A1* | 7/2018 | Mori | H10K 85/731 |
| 2018/0294315 A1* | 10/2018 | Shiomi | H10K 30/87 |
| 2018/0315788 A1 | 11/2018 | Kuo et al. | |
| 2020/0404207 A1 | 12/2020 | Chu et al. | |
| 2021/0043689 A1 | 2/2021 | Tokuhara et al. | |
| 2021/0057168 A1 | 2/2021 | Shiomi et al. | |
| 2021/0066384 A1* | 3/2021 | Greco | H01L 27/14649 |

FOREIGN PATENT DOCUMENTS

| | | | |
|---|---|---|---|
| NO | 2016203724 A1 | 12/2016 | |
| WO | WO-2021187283 A1 * | 9/2021 | |

OTHER PUBLICATIONS

Shahiduzzaman et al. "Spray Pyrolyzed TiO2 Embedded Multi-Layer Front Contact Design for High-Efficiency Perovskite Solar Cells" Nano-Micro Letters 13(36): 1-17 (2021).

* cited by examiner

HYBRID IMAGE SENSORS HAVING OPTICAL AND SHORT-WAVE INFRARED PIXELS INTEGRATED THEREIN

REFERENCE TO PRIORITY APPLICATION

This U.S. nonprovisional application claims priority under 35 U.S.C § 119 to Korean Patent Application No. 10-2021-0103429, filed Aug. 5, 2021, the disclosure of which is hereby incorporated herein by reference.

BACKGROUND

The present inventive concepts relate to image capture devices and, more particularly, to complementary metal oxide semiconductor (CMOS) image sensors.

An image sensor can be a semiconductor device that transforms optical images into electrical signals. Recent advances in computer and communication industries have led to strong demands in high performances image sensors in various consumer electronic devices such as digital cameras, camcorders, PCSs (Personal Communication Systems), game devices, security cameras, medical micro cameras, etc. An image sensor can typically be classified into a charge coupled device (CCD) type and a complementary metal oxide semiconductor (CMOS) type. A CMOS type image sensor is abbreviated to CIS (CMOS image sensor). The CIS has a plurality of two-dimensionally arranged pixels, and each of the pixels includes a photodiode (PD). The photodiodes serve to transform incident light into electrical signals.

In order to detect light having a wavelength range other than that of visible light, there has recently been research on an image sensor that uses a photoelectric device different from conventional semiconductor photoelectric devices.

SUMMARY

Some embodiments of the present inventive concepts provide an image sensor having increased efficiency for detecting short-wave infrared (SWIR) radiation in additional to visible light radiation.

Some embodiments of the present inventive concepts provide a hybrid image sensor having interspersed arrays of pixels for sensing visible light and pixels for sensing short-wave infrared (SWIR) radiation.

In some embodiments of the present inventive concepts, an image sensor pixel is provided, which includes a substrate having a pixel electrode on a light receiving surface thereof, and a photoelectric conversion layer including a perovskite material, on the pixel electrode. In these embodiments, a transparent electrode is also provided on the photoelectric conversion layer. And, a vertical electrode is provided, which is electrically connected to the pixel electrode and extends at least partially through the substrate, which includes a floating diffusion region therein that is electrically connected to the vertical electrode. In some of these embodiments, the photoelectric conversion layer includes a perovskite layer, a first blocking layer extending between the pixel electrode and the perovskite layer, and a second blocking layer extending between the transparent electrode and the perovskite layer.

In addition, the first blocking layer may include a material that induces a first potential barrier at a first interface between the first blocking layer and the perovskite layer, which preferentially blocks electrons generated within the perovskite layer from transferring across the first interface. In contrast, the second blocking layer may include a material that induces a second potential barrier at a second interface between the second blocking layer and the perovskite layer, which preferentially blocks holes generated within the perovskite layer from transferring across the second interface. To achieve these goals, the first blocking layer may include at least one material selected from a group consisting of NiO, $MoO_3$, and $V_2O_5$, and the second blocking layer may include at least one material selected from a group consisting of $TiO_2$, $HfO_2$, $SnO_2$, and ZnO. The perovskite material may also have a material structure of $ABX_3$, $A_2BX_4$, $A_3BX_5$, $A_4BX_6$, $ABX_4$, or $A_{n-1}B_nX_{3n+1}$, where: (i) n is a positive integer in a range from 2 to 6, (ii) A includes at least one material selected from a group consisting of Na, K, Rb, Cs and Fr, (iii) B includes at least one material selected from a divalent transition metal, a rare earth metal, an alkaline earth metal, Ga, In, Al, Sb, Bi, and Po, and (iv) X includes at least one material selected from Cl, Br, and I.

According to additional embodiments of the present inventive concepts, an image sensor may include a pixel array that includes a plurality of pixels. Each of the plurality of pixels may include a substrate having a first surface and a second surface opposite to each other. The plurality of pixels may include a plurality of first pixels and at least one second pixel. The first and second pixels may be arranged along a first direction and a second direction that are parallel to the first surface of the substrate. Each of the first pixels may include a photoelectric conversion region in the substrate. The second pixel may include a pixel electrode, a photoelectric conversion layer, and a transparent electrode that are sequentially stacked on the second surface of the substrate. The photoelectric conversion layer may include a perovskite layer.

According to further embodiments of the present inventive concepts, an image sensor may include: a pixel electrode, a photoelectric conversion layer, and a transparent electrode that are sequentially stacked on a substrate; a vertical electrode extending between the substrate and the pixel electrode; and a floating diffusion region in the substrate. The photoelectric conversion layer may extend between the pixel electrode and the transparent electrode. The vertical electrode may be connected to the pixel electrode and the floating diffusion region. The photoelectric conversion layer may include: a perovskite layer; a first blocking layer between the pixel electrode and the perovskite layer; and a second blocking layer between the transparent electrode and the perovskite layer.

DETAILED DESCRIPTION OF EMBODIMENTS

The following will now describe in detail some embodiments of the present inventive concepts with reference to the accompanying drawings.

Figure 1:
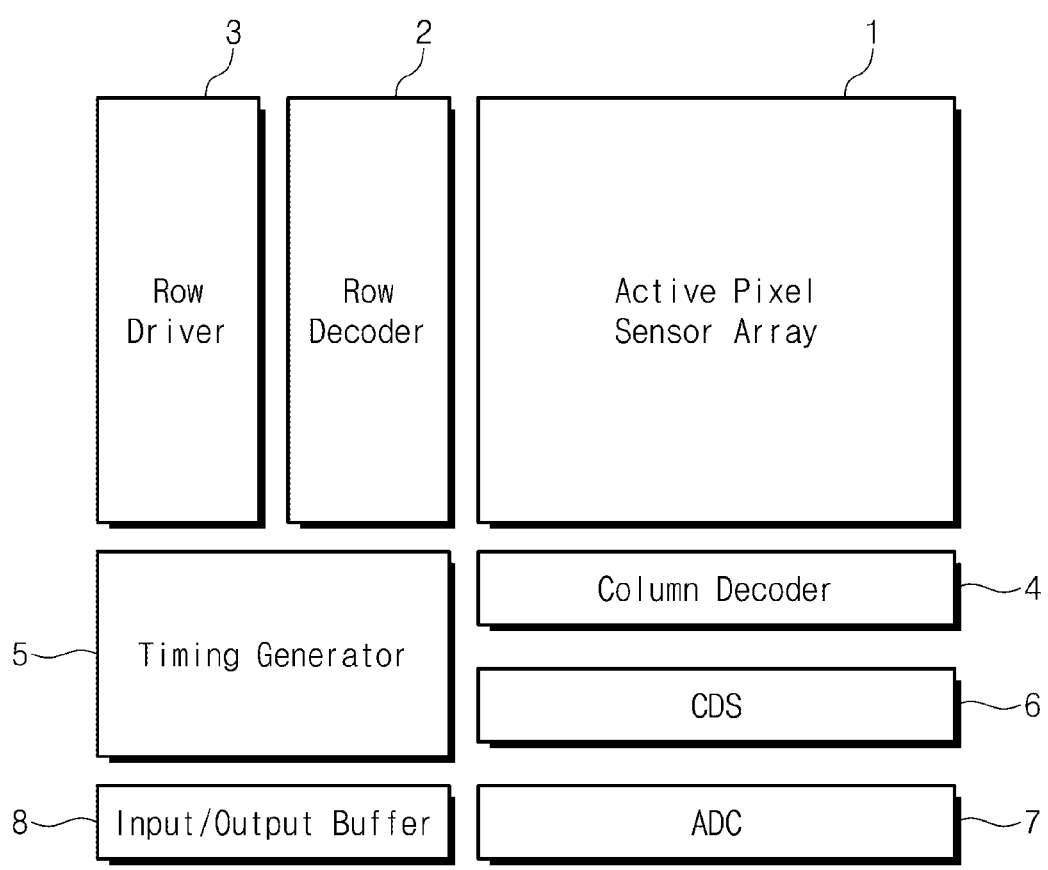
FIG. 1 illustrates a simplified block diagram of an image sensor according to some embodiments of the present inventive concepts.

FIG. 1 illustrates a simplified block diagram showing an image sensor according to some embodiments of the present inventive concepts. Referring to FIG. 1, an image sensor may include an active pixel sensor array 1, a row decoder 2, a row driver 3, a column decoder 4, a timing generator 5, a correlated double sampler (CDS) 6, an analog-to-digital converter (ADC) 7, and an input/output buffer 8. The active pixel sensor array 1 may include a plurality of two-dimensionally arranged pixels, which may be configured to convert optical signals into electrical signals. The active pixel sensor array 1 may be driven by a plurality of driving signals, such as a pixel selection signal, a reset signal, and a charge transfer signal, which are provided from the row driver 3. In addition, the correlated double sampler 6 may be provided with the electrical signals which are converted by the active pixel sensor array 1. The row driver 3 may provide the active pixel sensor array 1 with several driving signals for driving several pixels in accordance with a decoded result obtained from the row decoder 2. In the event the plurality of pixels are arranged in a matrix shape, the driving signals may be provided for each row.

The timing generator 5 may provide timing and control signals to the row decoder 2 and the column decoder 4. The correlated double sampler (CDS) 6 may receive the electrical signals generated from the active pixel sensor array 1, and may hold and sample the received electrical signals. The correlated double sampler 6 may perform a double sampling operation to sample a specific noise level and a signal level of the electrical signal, and then may output a difference level corresponding to a difference between the noise and signal levels. The analog-to-digital converter 7 may convert analog signals, which correspond to the difference level received from the correlated double sampler 6, into digital signals and then output the converted digital signals. The input/output buffer 8 may latch the digital signals and then sequentially output the latched digital signals to an image signal processing unit (not shown) in response to the decoded result obtained from the column decoder 4.

Figure 2:
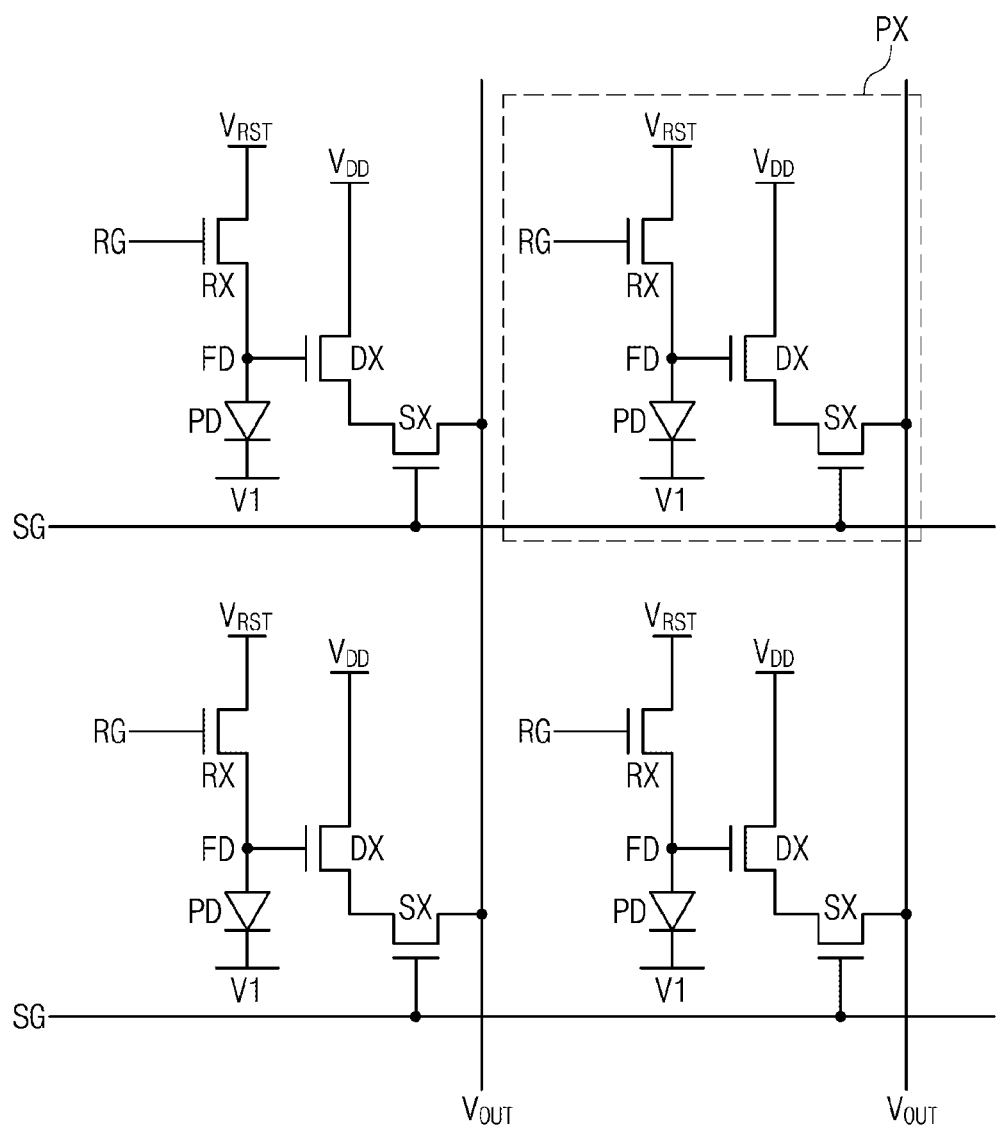
FIG. 2 illustrates an electrical circuit diagram of an active pixel sensor array of an image sensor according to some embodiments of the present inventive concepts.

FIG. 2 illustrates a circuit diagram showing an active pixel sensor array of an image sensor according to some embodiments of the present inventive concepts. Referring to FIGS. 1 and 2, the active pixel sensor array 1 may include a plurality of pixels PX, that are arranged in a matrix shape. Each of the pixels PX may include a photoelectric conversion element PD and a floating diffusion region FD. The photoelectric conversion element PD may create and accumulate photo-charges in proportion to an amount of externally incident light. According to some embodiments of the present inventive concepts, the photoelectric conversion element PD may use holes as carriers, and in this case, a first voltage V1 may be applied to one electrode of the photoelectric conversion element PD. The first voltage V1 may be greater than 0 V, for example, may be about 3 V. The floating diffusion region FD may be connected to another electrode of the photoelectric conversion element PD. The floating diffusion region FD may accumulate and store charges that are generated and transferred from the photoelectric conversion element PD. Each of the pixels PX may include a reset transistor RX, a selection transistor SX, and a drive transistor DX. The reset transistor RX and the selection transistor SX may respectively include a reset gate RG and a selection gate SG.

The reset transistor RX may periodically reset the charges accumulated in the floating diffusion region FD. The floating diffusion region FD may be connected to one electrode of the reset transistor RX. A reset voltage $V_{RST}$ may be applied to another electrode of the reset transistor RX. The reset voltage $V_{RST}$ may be different from a power voltage $V_{DD}$. When the reset transistor RX is turned on, the reset transistor RX may provide the floating diffusion region FD with the reset voltage $V_{RST}$. Accordingly, when the reset transistor RX is turned on, the charges accumulated in the floating diffusion region FD may be exhausted and thus the floating diffusion region FD may be reset.

The drive transistor DX may be controlled by an amount of photo-charges accumulated in the floating diffusion region FD. The drive transistor DX may serve as a source follower buffer amplifier. The power voltage $V_{DD}$ may be applied to one electrode of the drive transistor DX, and another electrode of the drive transistor DX may be connected to one electrode of the selection transistor SX. The drive transistor DX may amplify a variation in electrical potential of the floating diffusion region FD and may output the amplified electrical potential to an output line $V_{OUT}$. The selection transistor SX may select each row of the pixels PX to be readout. When the selection transistor SX is turned on, the power voltage $V_{DD}$ may be applied to the one electrode of the drive transistor DX.

FIG. 2 depicts by way of example a unit pixel PX that includes one photoelectric conversion element PD and three transistors RX, DX, and SX, but the image senor according the present inventive concepts are not limited thereto. For example, neighboring pixels PX may share the reset transistor RX, the drive transistor DX, and/or the selection transistor SX so that the image sensor may be more highly integrated.

Figure 3:
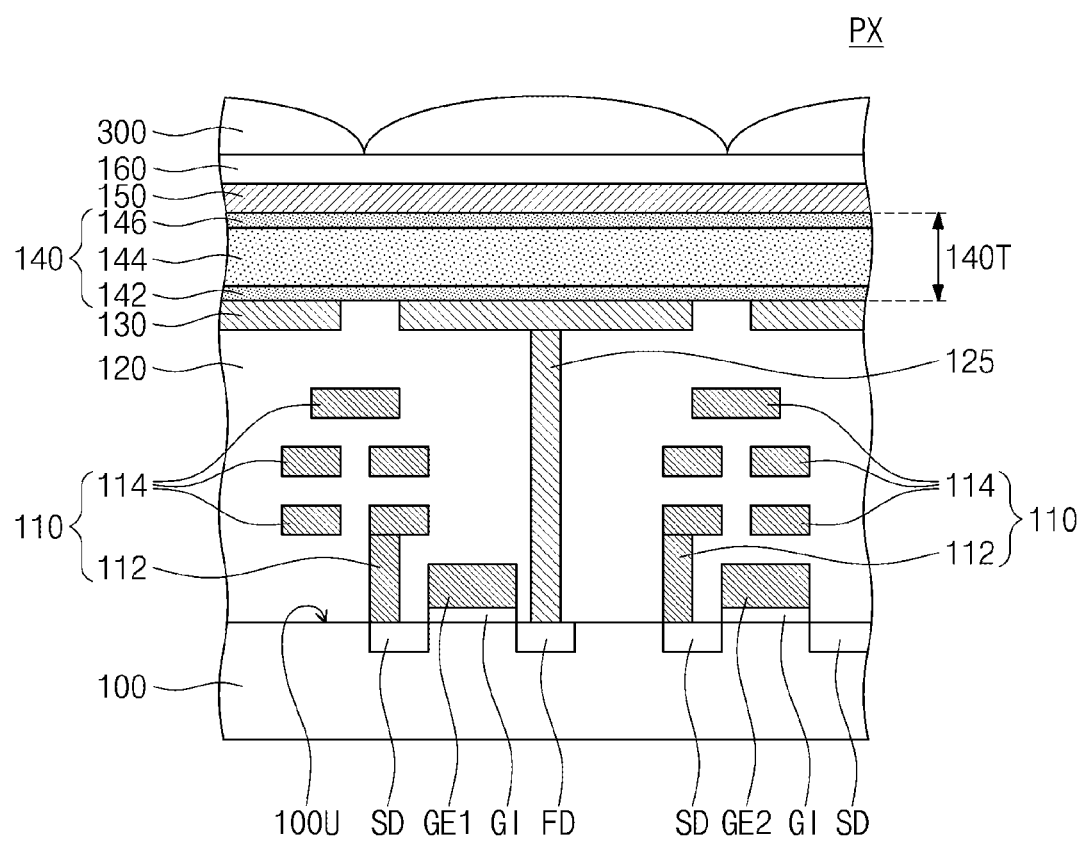
FIG. 3 illustrates a cross-sectional view of an image sensor according to some embodiments of the present inventive concepts.
Figure 4:
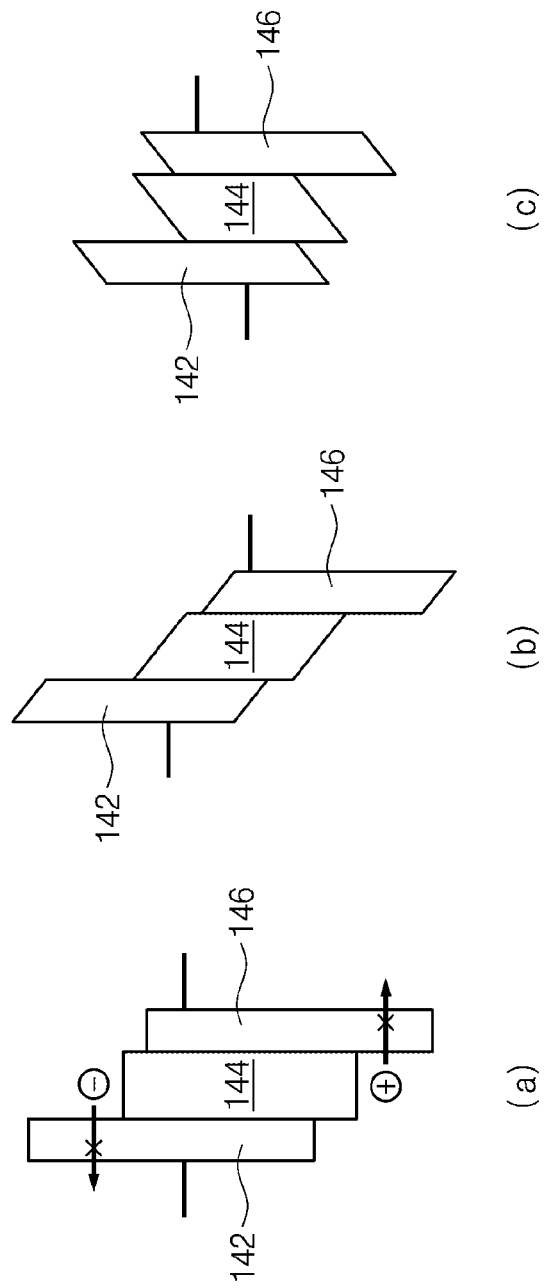
FIG. 4 illustrates a simplified energy band diagram of a photoelectric conversion layer depicted in FIG. 3.

FIG. 3 illustrates a cross-sectional view showing an image sensor according to some embodiments of the present inventive concepts. FIG. 4 illustrates a simplified energy band diagram of a photoelectric conversion layer depicted in FIG. 3. Referring to FIG. 3, an image sensor may include a pixel PX configured to detect short-wave infrared (SWIR) radiation. The pixel PX may be provided in plural, and the plurality of pixels PX may be arranged in a matrix shape as discussed with reference to FIG. 2. The pixel PX may be configured to operate as discussed with reference to FIG. 2.

The pixel PX may include a substrate 100, source/drain regions SD in the substrate 100, and a floating diffusion region FD in the substrate 100. The substrate 100 may be a semiconductor substrate (e.g., a silicon substrate, a germanium substrate, a silicon-germanium substrate, a II-VI group compound semiconductor substrate, or a III-V group compound semiconductor substrate) or a silicon-on-insulator (SOI) substrate. The source/drain regions SD and the floating diffusion region FD may be disposed adjacent to a top surface 1000 of the substrate 100. The substrate 100 may have a first conductivity type, and the source/drain regions SD and the floating diffusion region FD may have a second conductivity type different from the first conductivity type. For example, the first conductivity type may be p-type, and the second conductivity type may be n-type. The source/drain regions SD and the floating diffusion region FD may be areas doped with impurities of the second conductivity type (e.g., n-type).

The pixel PX may further include gate electrodes GE1 and GE2 on the top surface 1000 of the substrate 100, and may also further include gate dielectric patterns GI between the substrate 100 and the gate electrodes GE1 and GE2. A first gate electrode GE1 of the gate electrodes GE1 and GE2 may be disposed between the floating diffusion region FD and one of the source/drain regions SD, and a second gate electrode GE2 of the gate electrodes GE1 and GE2 may be disposed between corresponding ones of the source/drain regions SD. The first gate electrode GE1, the one of the source/drain regions SD, and the floating diffusion region FD may constitute the reset transistor RX discussed with reference to FIG. 2, and the first gate electrode GE1 may correspond to the reset gate RG discussed with reference to FIG. 2. The second gate electrode GE2 and the corresponding source/drain regions SD may constitute one of the selection transistor SX and the drive transistor DX that are discussed with reference to FIG. 2. When the second gate electrode GE2 and the corresponding source/drain regions SD constitute the selection transistor SX, the second gate electrode GE2 may correspond to the selection gate SG discussed with reference to FIG. 2. The gate electrodes GE1 and GE2 may include a conductive material (e.g., one or more of doped semiconductor material and metal), and the gate dielectric patterns GI may include a dielectric material (e.g., silicon oxide).

The pixel PX may further include wiring patterns 110 and a vertical electrode 125 on the top surface 1000 of the substrate 100. The wiring patterns 110 may include conductive contacts 112 connected to the source/drain regions SD and conductive lines 114 connected to the conductive contacts 112. Each of the conductive contacts 112 may be electrically connected to a corresponding one of the source/drain regions SD and to a corresponding one of the conductive lines 114. The vertical electrode 125 may be electrically connected to the floating diffusion region FD. The conductive contacts 112, the conductive lines 114, and the vertical electrode 125 may include a conductive material. The pixel PX may further include an interlayer dielectric layer 120 that lies on the top surface 100U of the substrate 100 and covers the gate electrodes GE1 and GE2, the wiring patterns 110, and the vertical electrode 125. The interlayer dielectric layer 120 may include a dielectric material, such as silicon oxide, silicon nitride, aluminum oxide, and hafnium oxide.

The pixel PX may further include a photoelectric conversion layer 140 on the interlayer dielectric layer 120, a pixel electrode 130 between the photoelectric conversion layer 140 and the interlayer dielectric layer 120, and a transparent electrode 150 on the photoelectric conversion layer 140. The photoelectric conversion layer 140 may be interposed between the pixel electrode 130 and the transparent electrode 150. The pixel electrode 130 may be connected to the vertical electrode 125. The photoelectric conversion layer 140 may be electrically connected to the floating diffusion region FD through the pixel electrode 130 and the vertical electrode 125. The photoelectric conversion layer 140 may constitute the photoelectric conversion element PD discussed with reference to FIG. 2, and charges generated from the photoelectric conversion layer 140 may be transferred to the floating diffusion region FD through the pixel electrode 130 and the vertical electrode 125. The pixel electrode 130 may include at least one selected from TiN, TaN, Cu, indium tin oxide (ITO), Au, and Ag, and the transparent electrode 150 may include at least one selected from indium tin oxide (ITO), indium zinc oxide (IZO), ZnO, $SnO_2$. The photoelectric conversion layer 140 may have a thickness 140T in a direction perpendicular to the top surface 1000 of the substrate 100, and the thickness 140T of the photoelectric conversion layer 140 may be less than about 500 nm, for example.

The photoelectric conversion layer 140 may include a first blocking layer 142, a perovskite layer 144, and a second blocking layer 146 that are sequentially stacked on the pixel electrode 130. The first blocking layer 142 may be interposed between the perovskite layer 144 and the pixel electrode 130, and the second blocking layer 146 may be interposed between the perovskite layer 144 and the transparent electrode 150.

The perovskite layer 144 may include a perovskite material having a structure of $ABX_3$, $A_2BX_4$, $A_3BX_5$, $A_4BX_6$, $ABX_4$, or $A_{n-1}B_nX_{3n+1}$, where n is an integer in a range from 2 to 6. The symbol A may include at least one material selected from Na, K, Rb, Cs, Fr, and any derivative thereof. The symbol B may include at least one material selected from a divalent transition metal, a rare earth metal, an alkaline earth metal, Ga, In, Al, Sb, Bi, and Po. For example, the symbol B may include at least one material selected from Sn, Ge, Ga, In, Al, Sb, Bi, Po, Eu, Yb, Ca, and Sr. The symbol X may include at least one material selected from Cl, Br, and I. The perovskite layer 144 may include, for example, $CsSnI_3$.

The first blocking layer 142 may be a potential barrier layer that blocks movement of electrons generated from the perovskite layer 144, and the second blocking layer 146 may be a potential barrier layer that blocks movement of holes generated from the perovskite layer 144. For example, the first blocking layer 142 may include at least one compound selected from NiO, $MoO_3$, and $V_2O_5$, and the second blocking layer 146 may include at least one compound selected from $TiO_2$, $HfO_2$, $SnO_2$, and ZnO.

Referring to FIG. 4(a), when no bias is applied to the pixel electrode 130 and the transparent electrode 150, the first blocking layer 142 may provide a potential barrier that blocks movement of electrons, and the second blocking layer 146 may provide a potential barrier that blocks movement of holes. Referring to FIG. 4(b), when a reverse bias is applied to the pixel electrode 130 and the transparent electrode 150, a potential barrier of each of the first and second blocking layers 142 and 146 may become higher to block movement of electrons and holes generated from the perovskite layer 144. Referring to FIG. 4(c), when a forward bias is applied to the pixel electrode 130 and the transparent electrode 150, a potential barrier of each of the first and second blocking layers 142 and 146 may become lower to produce a flow of current due to movement of electrons and holes generated from the perovskite layer 144. According to some embodiments of the present inventive concepts, the first and second blocking layers 142 and 146 may be used to minimize leakage current in the pixel PX.

Referring back to FIG. 3, the pixel PX may further include a protection layer 160 and a microlens 300 that are sequentially stacked on the transparent electrode 150. The protection layer 160 may protect the transparent electrode 150 and the photoelectric conversion layer 140, and may include a dielectric material. The microlens 300 may be disposed on the protection layer 160. The microlens 300 may vertically overlap the photoelectric conversion layer 140 along a direction perpendicular to the top surface 1000 of the substrate 100.

During operation, incident light may enter to the microlens through an infrared filter. The filtered incident light may be short-wave infrared (SWIR) radiation. The filtered incident light may be condensed by the microlens 300 and may be incident on the photoelectric conversion layer 140. The photoelectric conversion layer 140 may generate and accumulate photo-charges from the filtered incident light (i.e. short-wave infrared radiation), and therefore the pixel PX may be configured to detect short-wave infrared (SWIR) radiation.

According to the present inventive concepts, the pixel PX may be configured to detect short-wave infrared (SWIR) radiation, and the photoelectric conversion layer 140 of the pixel PX may include the perovskite layer 144. As the photoelectric conversion layer 140 includes a perovskite material that exhibits relatively high charge mobility, short-wave infrared (SWIR) radiation may be easily detected. In addition, as the photoelectric conversion layer 140 includes a perovskite material capable of being etched, it is easily achieved to isolate the photoelectric conversion layer 140 of the pixel PX from the photoelectric conversion layer 140 of a neighboring pixel PX by an etching process. Therefore, isolation between neighboring pixels PX may be easily accomplished.

In addition, the photoelectric conversion layer 140 may further include the first blocking layer 142 and the second blocking layer 146. The first blocking layer 142 and the second blocking layer 146 may provide potential barriers that block movement of electrons and holes generated from the perovskite layer 144, and thus leakage current may be minimized in the pixel PX. Accordingly, it may be possible to provide an image sensor that includes pixels having increased efficiency for detecting short-wave infrared radiation.

Figure 5:
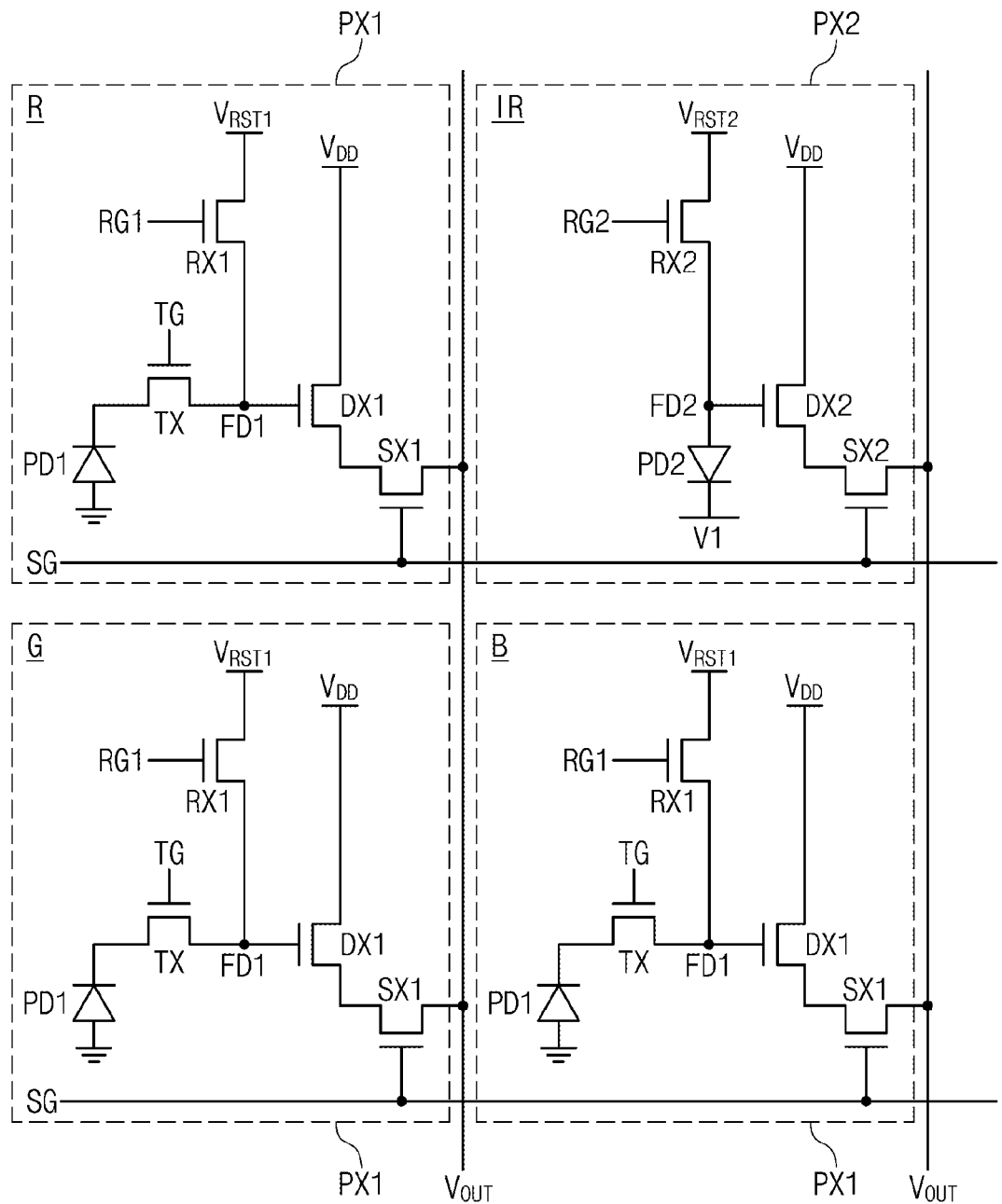
FIG. 5 illustrates an electrical circuit diagram of an active pixel sensor array of an image sensor according to some embodiments of the present inventive concepts.

FIG. 5 illustrates a circuit diagram showing an active pixel sensor array of an image sensor according to some embodiments of the present inventive concepts. Referring to FIGS. 1 and 5, the active pixel sensor array 1 may include a plurality of pixels PX1 and PX2, which are arranged in a matrix shape. The pixels PX1 and PX2 may include (red, green, blue) RGB pixels PX1 and an IR pixel PX2, which neighbor each other.

Each of the RGB pixels PX1 may include a transfer transistor TX and logic transistors. The logic transistors may include a first reset transistor RX1, a first selection transistor SX1, and a first drive transistor DX1. The transfer transistor TX, the first reset transistor RX1, and the first selection transistor SX1 may respectively include a transfer gate TG, a first reset gate RG1, and a selection gate SG. Each of the RGB pixels PX1 may further include a first photoelectric conversion element PD1 and a first floating diffusion region FD1.

The first photoelectric conversion element PD1 may create and accumulate photo-charges in proportion to an amount of externally incident light. The first photoelectric conversion element PD1 may be a silicon photodiode that includes a p-type impurity region and an n-type impurity region. The transfer transistor TX may transfer charges generated in the first photoelectric conversion element PD1 into the first floating diffusion region FD1. The first floating diffusion region FD1 may accumulate and store charges that are generated and transferred from the first photoelectric conversion element PD1. The first drive transistor DX1 may be controlled by an amount of photo-charges accumulated in the first floating diffusion region FD1.

The first reset transistor RX1 may periodically reset the charges accumulated in the first floating diffusion region FD1. One electrode of the first reset transistor RX1 may be connected to the first floating diffusion region FD1, and another electrode of the first reset transistor RX1 may be connected to a first reset voltage $V_{RST1}$. For example, the first reset voltage $V_{RST1}$ may be the same as a power voltage $V_{DD}$. When the first reset transistor RX1 is turned on, the first floating diffusion region FD1 may be provided with the first reset voltage $V_{RST1}$ connected to the other electrode of the first reset transistor RX1. Accordingly, when the first reset transistor RX1 is turned on, the charges accumulated in the first floating diffusion region FD1 may be exhausted and thus the first floating diffusion region FD1 may be reset.

As will be understood by those skilled in the art, first drive transistor DX1 may serve as a source follower buffer amplifier. The first drive transistor DX1 may amplify a variation in electrical potential of the first floating diffusion region FD1 and may output the amplified electrical potential to an output line $V_{OUT}$. The first selection transistor SX1 may select each row of the RGB pixels PX1 to be readout. When the first selection transistor SX1 is turned on, the power voltage $V_{DD}$ may be applied to one electrode of the first drive transistor DX1. Different from what is shown, neighboring RGE pixels PX1 may share the first reset transistor RX1, the first drive transistor DX1, and/or the first selection transistor SX1, to thereby increase image sensor integration.

The IR pixel PX2 may include a second photoelectric conversion element PD2 and a second floating diffusion region FD2. The second photoelectric conversion element PD2 may create and accumulate photo-charges in proportion to an amount of externally incident light. A first voltage V1 may be applied to one electrode of the second photoelectric conversion element PD2. The first voltage V1 may be greater than 0 V, for example, may be about 3 V. The second floating diffusion region FD2 may be connected to another electrode of the second photoelectric conversion element PD2. The second floating diffusion region FD2 may accumulate and store charges that are generated and transferred from the second photoelectric conversion element PD2. The IR pixel PX2 may include a second reset transistor RX2, a second selection transistor SX2, and a second drive transistor DX2. The second reset transistor RX2 and the second selection transistor SX2 may respectively include a second reset gate RG2 and the selection gate SG.

The IR pixel PX2 may be configured identically to the unit pixel PX discussed with reference to FIG. 2. In this case, the second photoelectric conversion element PD2, the second floating diffusion region FD2, the second reset transistor RX2, the second selection transistor SX2, and the second drive transistor DX2 may be substantially the same as the photoelectric conversion element PD, the floating diffusion region FD, the reset transistor RX, the selection transistor SX, and the drive transistor DX of FIG. 2. A second reset voltage $V_{RST2}$ applied to the second reset transistor RX2 may correspond to the reset voltage $V_{RST}$ of FIG. 2. For example, the second reset voltage $V_{RST2}$ may be different from the power voltage $V_{DD}$.

Figure 6:
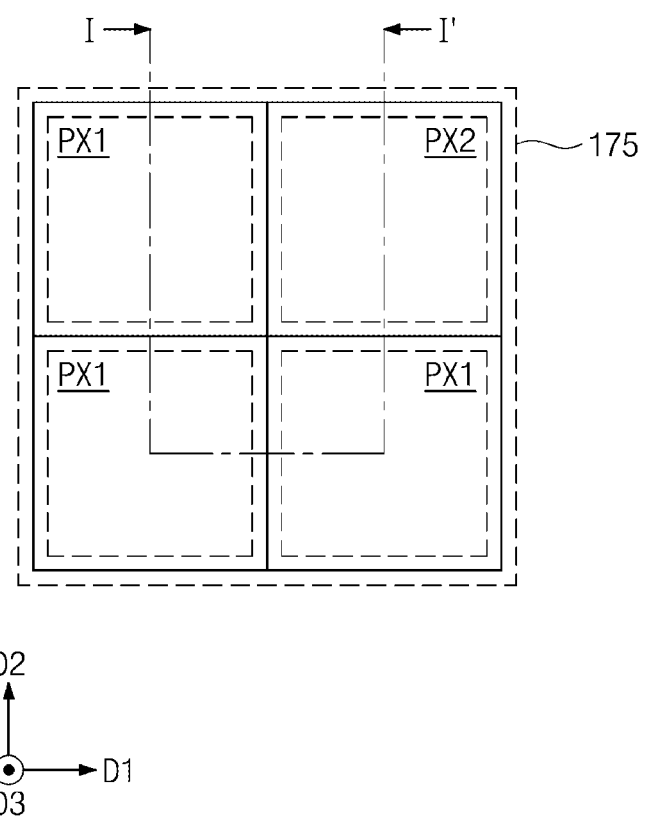
FIG. 6 illustrates a plan layout view of an image sensor according to some embodiments of the present inventive concepts.
Figure 7:
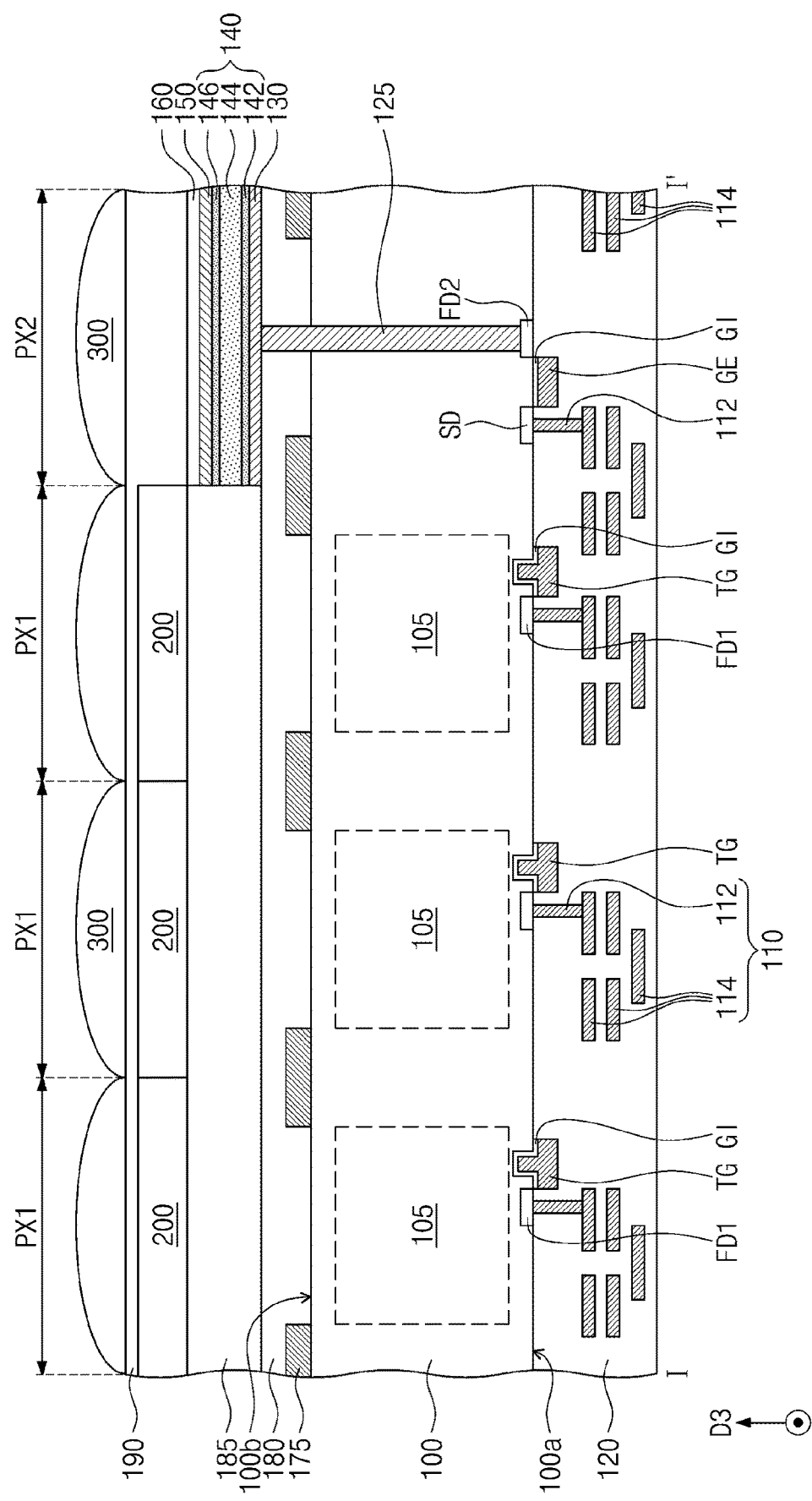
FIG. 7 illustrates a cross-sectional view taken along line I-I' of FIG. 6.

FIG. 6 illustrates a plan view showing an image sensor according to some embodiments of the present inventive concepts. FIG. 7 illustrates a cross-sectional view taken along line I-I' of FIG. 6. Referring to FIGS. 6 and 7, an image sensor may include a plurality of pixels PX1 and PX2, and the plurality of pixels PX1 and PX2 may be arranged in a matrix shape. The plurality of pixels PX1 and PX2 may include first pixels PX1 and at least one second pixel PX2. The first pixels PX1 may correspond to the RGB pixels PX1 of FIG. 6 and may be configured to operate the same as the RGB pixels PX1. The second pixel PX2 may correspond to the IR pixel PX2 of FIG. 6 and may be configured to operate the same as the IR pixel PX2.

Each of the plurality of pixels PX1 and PX2 may include a substrate 100. The substrate 100 may be a semiconductor substrate (e.g., a silicon substrate, a germanium substrate, a silicon-germanium substrate, a II-VI group compound semiconductor substrate, or a III-V group compound semiconductor substrate) or a silicon-on-insulator (SOI) substrate. The substrate 100 may have a first surface 100a and a second surface 100b opposite to each other. The plurality of pixels PX1 and PX2 may be arranged along a first direction D1 and a second direction D2 that intersect each other and are parallel to the first surface 100a of the substrate 100. The plurality of pixels PX1 and PX2 may directly neighbor each other. The second pixel PX2 may neighbor in the first direction D1 to one of the first pixels PX1 and neighbor in the second direction D2 to another of the first pixels PX1.

Each of the first pixels PX1 may include a photoelectric conversion region 105 disposed in the substrate 100. The substrate 100 may have a first conductivity type, and the photoelectric conversion region 105 may be an impurity region doped with impurities having a second conductivity type different from the first conductivity type so that a P-N rectifying junction is established between the conversion region 105 and the surrounding substrate 100. For example, the first conductivity type and the second conductivity type may be p-type and n-type, respectively. In this case, the impurities having the second conductive type may include n-type impurities, such as one or more of phosphorus, arsenic, bismuth, and antimony. The P-N rectifying junction between the photoelectric conversion region 105 and the substrate 100 may constitute a photodiode, which operates as the first photoelectric conversion element PD1 of FIG. 5.

Each of the first pixels PX1 may further include a transfer gate electrode TG on the first surface 100a of the substrate 100, a gate dielectric pattern GI between the substrate 100 and the transfer gate electrode TG, and a first floating diffusion region FD1 disposed adjacent to the first surface 100a of the substrate 100. The first floating diffusion region FD1 may be disposed in the substrate 100 on one side of the transfer gate electrode TG. The first floating diffusion region FD1 may be an area doped with impurities (or n-type impurities) having the second conductivity type different from the first conductivity type. A lower portion of the transfer gate electrode TG may extend into the substrate 100 along a third direction D3 perpendicular to the first surface 100a of the substrate 100. An upper portion of the transfer gate electrode TG may protrude upwardly from the first surface 100a of the substrate 100. The gate dielectric pattern GI may be interposed between the transfer gate electrode TG and the first surface 100a of the substrate 100, and may extend into the substrate 100 to interpose between the substrate 100 and the transfer gate electrode TG. The transfer gate electrode TG and the first floating diffusion region FD1 may constitute the transfer transistor TX of FIG. 6, and the transfer gate electrode TG may correspond to the transfer gate TG of FIG. 6. The transfer gate electrode TG may include a conductive material (e.g., one or more of doped semiconductor material and metal), and the gate dielectric pattern GI may include a dielectric material (e.g., silicon oxide).

Each of the first pixels PX1 may further include wiring patterns 110 on the first surface 100a of the substrate 100. The wiring patterns 110 may include conductive contacts 112 and conductive lines 114 connected to the conductive contacts 112. The first floating diffusion region FD1 may be electrically connected through a corresponding one of the conductive contacts 112 to a corresponding one of the conductive lines 114. The conductive contacts 112 and the conductive lines 114 may include a conductive material.

Each of the first pixels PX1 may further include an interlayer dielectric layer 120 that is disposed on the first surface 100a of the substrate 100 and that covers the transfer gate electrode TG and the wiring patterns 110. The interlayer dielectric layer 120 may include a dielectric material, such as silicon oxide, silicon nitride, aluminum oxide, and hafnium oxide.

Each of the first pixels PX1 may further include a grid pattern 175, a lower dielectric layer 180, a planarized layer 185, a color filter 200, an upper dielectric layer 190, and a microlens 300 that are disposed on the second surface 100b of the substrate 100. The grid pattern 175 may be disposed on the second surface 100b of the substrate 100 and may be offset along the third direction D3 from the photoelectric conversion region 105. The grid pattern 175 may be located on a boundary between the plurality of pixels PX1 and PX2, and when viewed in plan, may surround each of the plurality of pixels PX1 and PX2. When the substrate 100 receives light incident on the second surface 100b thereof, the grid pattern 175 may guide the light to travel toward the photoelectric conversion region 105. The grid pattern 175 may include metal (e.g., tungsten). Although not shown, an additional dielectric layer may be disposed between the grid pattern 175 and the second surface 100b of the substrate 100. The lower dielectric layer 180 may be disposed on the second surface 100b of the substrate 100, thereby covering the grid pattern 175. The lower dielectric layer 180 may extend between neighboring grid patterns 175 and cover the second surface 100b of the substrate 100. The lower dielectric layer 180 may include a dielectric material (e.g., one or more of silicon oxide, silicon nitride, and silicon oxynitride).

The planarized layer 185 may be disposed between the lower dielectric layer 180 and the color filter 200. The planarized layer 185 may include an optically transparent dielectric material (e.g., one or more of silicon oxide, silicon nitride, and silicon oxynitride). The color filter 200 may be disposed on the planarized layer 185 and may vertically overlap along the third direction D3 (normal to the substrate surface) with the photoelectric conversion region 105. The color filter 200 may be a visible light filter that is transparent to visible light of incident light. The photoelectric conversion region 105 may receive visible light that passes through the color filter 200, and may generate and accumulate photo-charges from the visible light. Therefore, the first pixels PX1 may be configured to detect the visible light.

The color filters 200 of the first pixels PX1 may be configured to be transparent to the visible light having different wavelength ranges. For example, the color filter 200 of one of the first pixels PX1 may be configured to allow red light to pass therethrough, the color filter 200 of another of the first pixels PX1 may be configured to allow green light to pass therethrough, and the color filter 200 of still another of the first pixels PX1 may be configured to allow blue light to pass therethrough.

The upper dielectric layer 190 may be disposed between the color filter 200 and the microlens 300. The upper dielectric layer 190 may include a dielectric material (e.g., one or more of silicon oxide, silicon nitride, and silicon oxynitride). The microlens 300 may be disposed on the upper dielectric layer 190 and may vertically overlap along the third direction D3 with the photoelectric conversion region 105. The microlens 300 may condense externally incident light, and the light incident through the microlens 300 may travel through the color filter 200 toward the photoelectric conversion region 105.

The second pixel PX2 may include a source/drain region SD and a second floating diffusion region FD2 that are disposed adjacent to the first surface 100a of the substrate 100. The source/drain region SD and the second floating diffusion region FD2 may have the second conductivity type different from the first conductivity type of the substrate 100. The source/drain region SD and the second floating diffusion region FD2 may be areas doped with impurities having the second conductivity type (e.g., n-type).

The second pixel PX2 may further include a gate electrode GE disposed on the first surface 100a of the substrate 100, and may also further include a gate dielectric pattern GI extending between the gate electrode GE and the first surface 100a of the substrate 100. The gate electrode GE may be disposed between the source/drain region SD and the second floating diffusion region FD2. The gate electrode GE, the source/drain region SD, and the second floating diffusion region FD2 may constitute the second reset transistor RX2 of FIG. 5, and the gate electrode GE may correspond to the second reset gate RG2 of FIG. 5. The gate electrode GE may include a conductive material (e.g., one or more of doped semiconductor material and metal), and the gate dielectric pattern GI may include a dielectric material (e.g., silicon oxide).

The second pixel PX2 may further include wiring patterns 110 on the first surface 100a of the substrate 100. The source/drain region SD may be electrically connected through a corresponding one of the conductive contacts 112 to a corresponding one of the conductive lines 114. The second pixel PX2 may further include the interlayer dielectric layer 120 disposed on the first surface 100a of the substrate 100, and may also further include the grid pattern 175 and the lower dielectric layer 180 that are disposed on the second surface 100b of the substrate 100. The interlayer dielectric layer 120 may cover the gate electrode GE and the wiring patterns 110. The lower dielectric layer 180 may cover the grid pattern 175 and may extend between neighboring grid patterns 175 to cover the second surface 100b of the substrate 100.

The second pixel PX2 may further include a vertical electrode 125 that at least partially penetrates the substrate 100. The vertical electrode 125 may be electrically connected (directly or indirectly) to the second floating diffusion region FD2. The vertical electrode 125 may penetrate along the third direction D3 through the substrate 100 and the lower dielectric layer 180. The vertical electrode 125 may penetrate the lower dielectric layer 180 between neighboring grid patterns 175. The vertical electrode 125 may include a low resistivity electrically conductive material. Although not shown, the vertical electrode 125 and the substrate 100 may be provided therebetween with an electrode barrier including a dielectric material. The vertical electrode 125 may be insulated through the electrode barrier from the substrate 100.

The second pixel PX2 may further include a pixel electrode 130, a photoelectric conversion layer 140, a transparent electrode 150, and a protection layer 160 that are sequentially stacked on the lower dielectric layer 180. The pixel electrode 130 may be interposed between the lower dielectric layer 180 and the photoelectric conversion layer 140, and the transparent electrode 150 may be disposed between the photoelectric conversion layer 140 and the protection layer 160. The photoelectric conversion layer 140 may be disposed between the pixel electrode 130 and the transparent electrode 150. The vertical electrode 125 may penetrate the lower dielectric layer 180 to have connection with the pixel electrode 130. The photoelectric conversion layer 140 may include a first blocking layer 142, a perovskite material layer 144, and a second blocking layer 146 that are sequentially stacked on the pixel electrode 130. The first blocking layer 142 may be interposed between the perovskite material layer 144 and the pixel electrode 130, and the second blocking layer 146 may be interposed between the perovskite layer 144 and the transparent electrode 150. The pixel electrode 130, the photoelectric conversion layer 140, the transparent electrode 150, and the protection layer 160 may be substantially the same as the pixel electrode 130, the photoelectric conversion layer 140, the transparent electrode 150, and the protection layer 160 that are discussed with respect to FIGS. 3 and 4.

The pixel electrode 130, the photoelectric conversion layer 140, the transparent electrode 150, and the protection layer 160 of the second pixel PX2 may be disposed on one side of the planarized layer 185 of each of the first pixels PX1. The planarized layer 185 may cover lateral surfaces of the pixel electrode 130, the photoelectric conversion layer 140, the transparent electrode 150, and the protection layer 160 included in the second pixel PX2.

The second pixel PX2 may further include the upper dielectric layer 190 on the protection layer 160. For example, the upper dielectric layer 190 of each of the first pixels PX1 may extend onto the protection layer 160 of the second pixel PX2. The upper dielectric layer 190 of the second pixel PX2 may cover a lateral surface of at least one of the color filters 200 of the first pixels PX1.

The second pixel PX2 may further include the microlens 300 on the upper dielectric layer 190. The microlens 300 may vertically overlap along the third direction D3 with the photoelectric conversion layer 140. The microlens 300 of the second pixel PX2 may receive externally incident light through an infrared filter. The filtered incident light may be short-wave infrared (SWIR) radiation. The filtered incident light may be condensed by the microlens 300 of the microlens 300 and may be incident on the photoelectric conversion layer 140. The photoelectric conversion layer 140 may generate and accumulate photo-charges from the filtered incident light (i.e. short-wave infrared radiation), and therefore the second pixel PX2 may be configured to detect short-wave infrared (SWIR) radiation.

According to the present inventive concepts, the first pixels PX1 may be configured to detect visible light (through color filters), and the second pixel PX2 (or second pixels) may be configured to detect short-wave infrared (SWIR) radiation. The photoelectric conversion layer 140 of the second pixel PX2 may include the perovskite layer 144. As the photoelectric conversion layer 140 of the second pixel PX2 includes a perovskite material that exhibits relatively high charge mobility, short-wave infrared (SWIR) radiation may be easily detected. In addition, as the photoelectric conversion layer 140 of the second pixel PX2 includes a perovskite material capable of being etched, it is easily achieved to isolate the photoelectric conversion layer 140 of the second pixel PX2 from the first pixels PX1 by an etching process. Accordingly, it may be easy to horizontally arrange, on the same substrate 100, the first pixels PX1 that detect visible and the second pixel PX2 that detects short-wave infrared (SWIR) radiation.

The following will discuss a method of fabricating an image sensor according to some embodiments of the present inventive concepts. For brevity of description, omission will be made to avoid a repetitive explanation of the image sensor discussed with reference to FIGS. 6 and 7.

Referring to FIG. 7, the photoelectric conversion region 105 of each of the first pixels PX1 may be formed in the substrate 100. The transfer gate electrode TG, the gate dielectric pattern GI, and the first floating diffusion region FD1 of each of the first pixels PX1 may be formed on the first surface 100a of the substrate 100, and the gate electrode GE, the gate dielectric pattern GI, the source/drain region SD, and the second floating diffusion region FD2 of the second pixel PX2 may be formed on the first surface 100a of the substrate 100. The wiring patterns 110 of each of the pixels PX1 and PX2 may be formed on the first surface 100a of the substrate 100, and the interlayer dielectric layer 120 may be formed on the first surface 100a of the substrate 100 so as to cover the wiring patterns 110.

The grid pattern 175 of each of the pixels PX1 and PX2 may be formed on the second surface 100b of the substrate 100, and the lower dielectric layer 180 may be formed on the second surface 100b of the substrate 100 so as to cover the grid pattern 175 of each of the pixels PX1 and PX2. The vertical electrode 125 of the second pixel PX2 may be formed in the lower dielectric layer 180 and the substrate 100. The vertical electrode 125 may be formed to penetrate along the third direction D3 through the lower dielectric layer 180 and the substrate 100, thereby being connected to the second floating diffusion region FD2.

The pixel electrode 130, the photoelectric conversion layer 140, the transparent electrode 150, and the protection layer 160 of the second pixel PX2 may be formed on the lower dielectric layer 180 of the second pixel PX2. The pixel electrode 130 may be electrically connected to the vertical electrode 125. For example, the formation of the pixel electrode 130, the photoelectric conversion layer 140, the transparent electrode 150, and the protection layer 160 of the second pixel PX2 may include sequentially forming a pixel electrode layer, a photoelectric conversion layer, a transparent electrode layer, and a protection layer on the second surface 100b of the substrate 100 on which lower dielectric layer 180 is formed, and etching the pixel electrode layer, the photoelectric conversion layer, the transparent electrode layer, and the protection layer to form the pixel electrode 130, the photoelectric conversion layer 140, the transparent electrode 150, and the protection layer 160 on the lower dielectric layer 180 of the second pixel PX2. In this case, as the photoelectric conversion layer 140 includes the perovskite layer 144, the photoelectric conversion layer 140 may be easily etched and thus the photoelectric conversion layer 140 of the second pixel PX2 may be easily isolated from the first pixels PX1.

The planarized layer 185 may be formed on the lower dielectric layer 180 of each of the first pixels PX1. The planarized layer 185 may be formed to cover lateral surfaces of the pixel electrode 130, the photoelectric conversion layer 140, the transparent electrode 150, and the protection layer 160 of the second pixel PX2. The color filter 200 may be formed on the planarized layer 185 of each of the first pixels PX1. The upper dielectric layer 190 may be formed to cover the color filters 200 of the first pixels PX1 and the protection layer 160 of the second pixel PX2. The microlens 300 may be formed on the upper dielectric layer 190 of each of the pixels PX1 and PX2.

Figure 8:
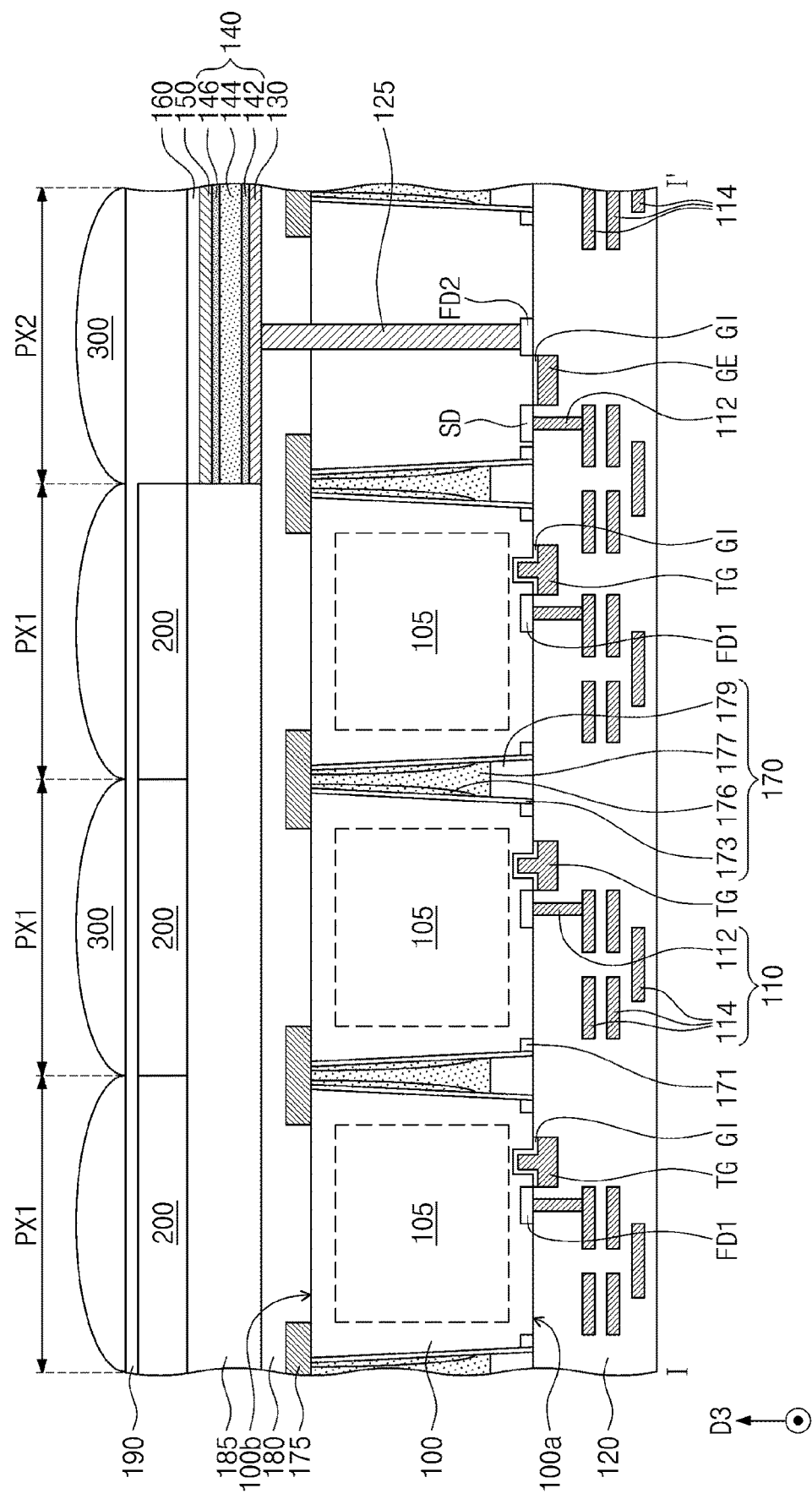
FIG. 8 illustrates an alternative cross-sectional view taken along line I-I' of FIG. 6, showing an image sensor according to some embodiments of the present inventive concepts.

FIG. 8 illustrates a cross-sectional view taken along line I-I' of FIG. 6, showing an image sensor according to some embodiments of the present inventive concepts. For brevity of description, the following will focus on differences from the image sensor discussed with reference to FIGS. 6 and 7.

Referring to FIGS. 6 and 8, each of the plurality of pixels PX1 and PX2 may further include a deep isolation pattern 170 that penetrates the substrate 100. The deep isolation pattern 170 may penetrate the substrate 100 along the third direction D3 perpendicular to the first surface 100a of the substrate 100. The first surface 100a of the substrate 100 may expose a bottom surface of the deep isolation pattern 170, and the second surface 100b of the substrate 100 may expose a top surface of the deep isolation pattern 170. The deep isolation pattern 170 may be disposed between the first pixels PX1 and between the second pixel PX2 and its neighboring first pixel PX1. The deep isolation pattern 170 may be disposed between the photoelectric conversion regions 105 of the first pixels PX1, and may prevent crosstalk between neighboring first pixels PX1.

The deep isolation pattern 170 may include a semiconductor pattern 176 and 177 that penetrates at least a portion of the substrate 100, a buried dielectric pattern 179 on the semiconductor pattern 176 and 177, and a lateral dielectric pattern 173 interposed between the substrate 100 and the semiconductor pattern 176 and 177. The lateral dielectric pattern 173 may extend from a lateral surface of the semiconductor pattern 176 and 177 onto a lateral surface of the buried dielectric pattern 179. The semiconductor pattern 176 and 177 may include a first semiconductor pattern 177 that penetrates at least a portion of the substrate 100 and a second semiconductor pattern 176 between the first semiconductor pattern 177 and the lateral dielectric pattern 173. The first semiconductor pattern 177 may cover the second semiconductor pattern 176 and may contact the lateral dielectric pattern 173. The buried dielectric pattern 179 may be disposed on the first semiconductor pattern 177. The first semiconductor pattern 177 may extend between the buried dielectric pattern 179 and the second semiconductor pattern 176, and may contact the lateral dielectric pattern 173.

Each of the first and second semiconductor patterns 177 and 176 may include a semiconductor material doped with impurities. The impurities may have a p-type or n-type conductivity type. For example, each of the first and second semiconductor patterns 177 and 176 may include polycrystalline silicon doped with boron. Each of the lateral dielectric pattern 173 and the buried dielectric pattern 179 may include, for example, one or more of silicon oxide, silicon nitride, and silicon oxynitride.

A shallow isolation pattern 171 may be disposed adjacent to the first surface 100a of the substrate 100. Each of the plurality of pixels PX1 and PX2 may include an active region defined by the shallow isolation pattern 171. The shallow isolation pattern 171 may include, for example, at least one selected from a silicon oxide layer, a silicon nitride layer, and a silicon oxynitride layer. The transfer gate electrode TG, the gate dielectric pattern GI, and the first floating diffusion region FD1 of each of the first pixels PX1 may be disposed on the active region of each of the first pixels PX1. The gate electrode GE, the gate dielectric pattern GI, the source/drain region SD, and the second floating diffusion region FD2 of the second pixel PX2 may be disposed on the active region of the second pixel PX2.

The deep isolation pattern 170 may penetrate the shallow isolation pattern 171 to thereby extend into the substrate 100. The buried dielectric pattern 179 of the deep isolation pattern 170 may be disposed in the shallow isolation pattern 171. The buried dielectric pattern 179 may penetrate the shallow isolation pattern 171 to thereby contact the semiconductor pattern 176 and 177. The lateral dielectric pattern 173 of the deep isolation pattern 170 may extend between the shallow isolation pattern 171 and the buried dielectric pattern 179. In addition, the grid pattern 175 of each of the pixels PX1 and PX2 may vertically overlap along the third direction D3 with the deep isolation pattern 170. Except that discussed above, an image sensor according to the present embodiment may be substantially the same as the image sensor discussed with reference to FIGS. 6 and 7.

Figure 9:
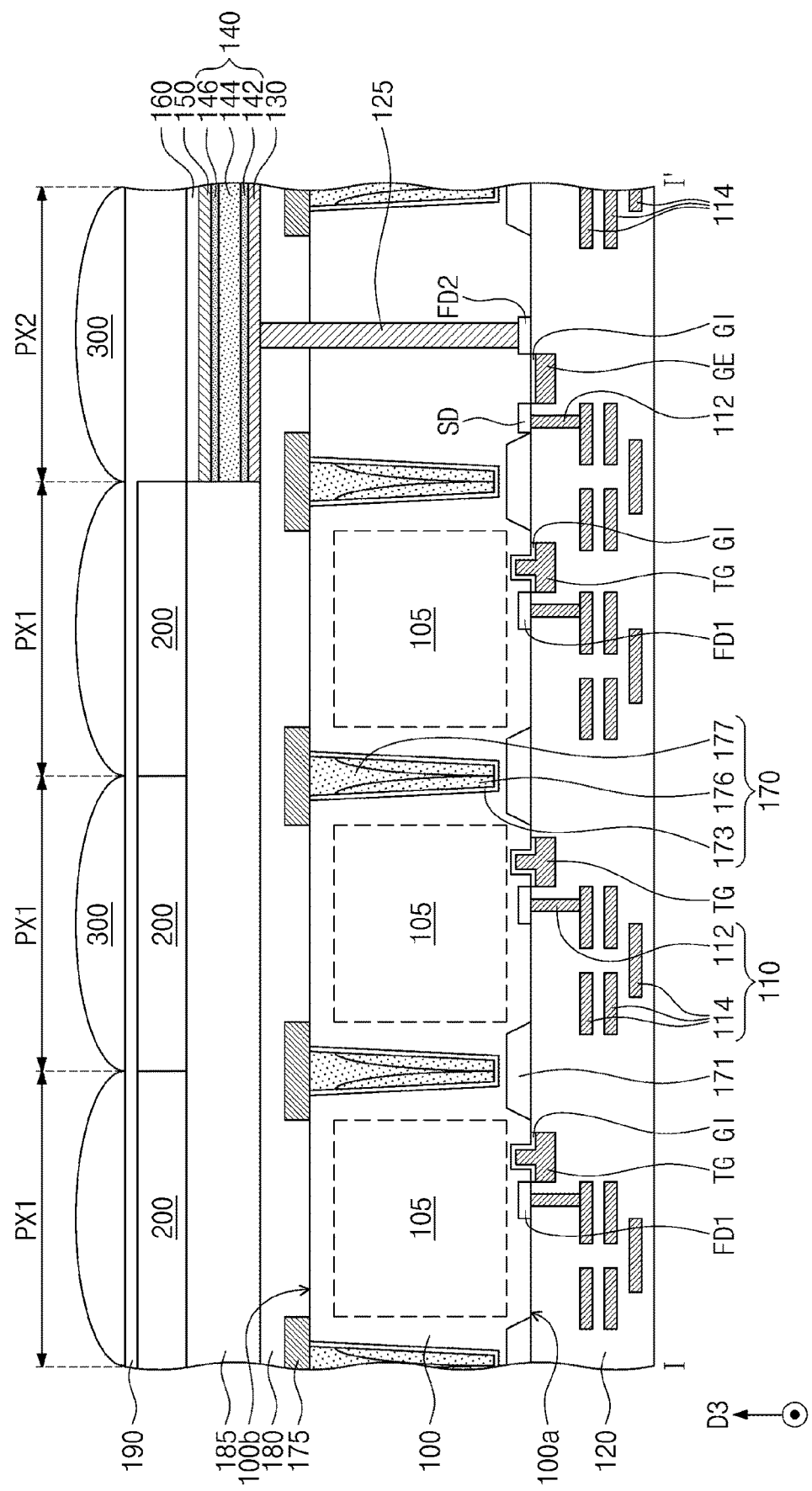
FIG. 9 illustrates an alternative cross-sectional view taken along line I-I' of FIG. 6, showing an image sensor according to some embodiments of the present inventive concepts.

FIG. 9 illustrates a cross-sectional view taken along line I-I' of FIG. 6, showing an image sensor according to some embodiments of the present inventive concepts. For brevity of description, the following will focus on differences from the image sensor discussed with reference to FIGS. 6 and 7. Referring to FIGS. 6 and 9, each of the plurality of pixels PX1 and PX2 may further include a deep isolation pattern 170 that penetrates a portion of the substrate 100. The deep isolation pattern 170 may penetrate a portion of the substrate 100 while extending along the third direction D3 from the second surface 100b of the substrate 100 toward the first surface 100a of the substrate 100. The deep isolation pattern 170 may be disposed between the first pixels PX1 and between the second pixel PX2 and its neighboring first pixel PX1. The deep isolation pattern 170 may be disposed between the photoelectric conversion regions 105 of the first pixels PX1, and may prevent crosstalk between neighboring first pixels PX1.

The deep isolation pattern 170 may include a semiconductor pattern 176 and 177 that penetrates a portion of the substrate 100, and may also include a lateral dielectric pattern 173 between the substrate 100 and the semiconductor pattern 176 and 177. The lateral dielectric pattern 173 may extend from a lateral surface of the semiconductor pattern 176 and 177 and along a bottom surface of the semiconductor pattern 176 and 177. The lateral dielectric pattern 173 may be interposed between the substrate 100 and the lateral surface of the semiconductor pattern 176 and 177, and may extend between the substrate 100 and the bottom surface of the semiconductor pattern 176 and 177. The semiconductor patterns 176 and 177 may include a first semiconductor pattern 177 that penetrates a portion of the substrate 100 and a second semiconductor pattern 176 between the first semiconductor pattern 177 and the lateral dielectric pattern 173. The first semiconductor pattern 177, the second semiconductor pattern 176, and the lateral dielectric pattern 173 may include the same material as that of the first semiconductor pattern 177, the second semiconductor pattern 176, and the lateral dielectric pattern 173, respectively, that are discussed with reference to FIGS. 6 and 8.

A shallow isolation pattern 171 may be disposed adjacent to the first surface 100a of the substrate 100. Each of the plurality of pixels PX1 and PX2 may include an active region defined by the shallow isolation pattern 171. The transfer gate electrode TG, the gate dielectric pattern GI, and the first floating diffusion region FD1 of each of the first pixels PX1 may be disposed on the active region of each of the first pixels PX1. The gate electrode GE, the gate dielectric pattern GI, the source/drain region SD, and the second floating diffusion region FD2 of the second pixel PX2 may be disposed on the active region of the second pixel PX2.

The deep isolation pattern 170 may be spaced apart along the third direction D3 from the shallow isolation pattern 171, and may vertically overlap along the third direction D3 with the shallow isolation pattern 171. The grid pattern 175 of each of the pixels PX1 and PX2 may vertically overlap along the third direction D3 with the deep isolation pattern 170. Except that discussed above, an image sensor according to the present embodiment may be substantially the same as the image sensor discussed with reference to FIGS. 6 and 7.

Figure 10:
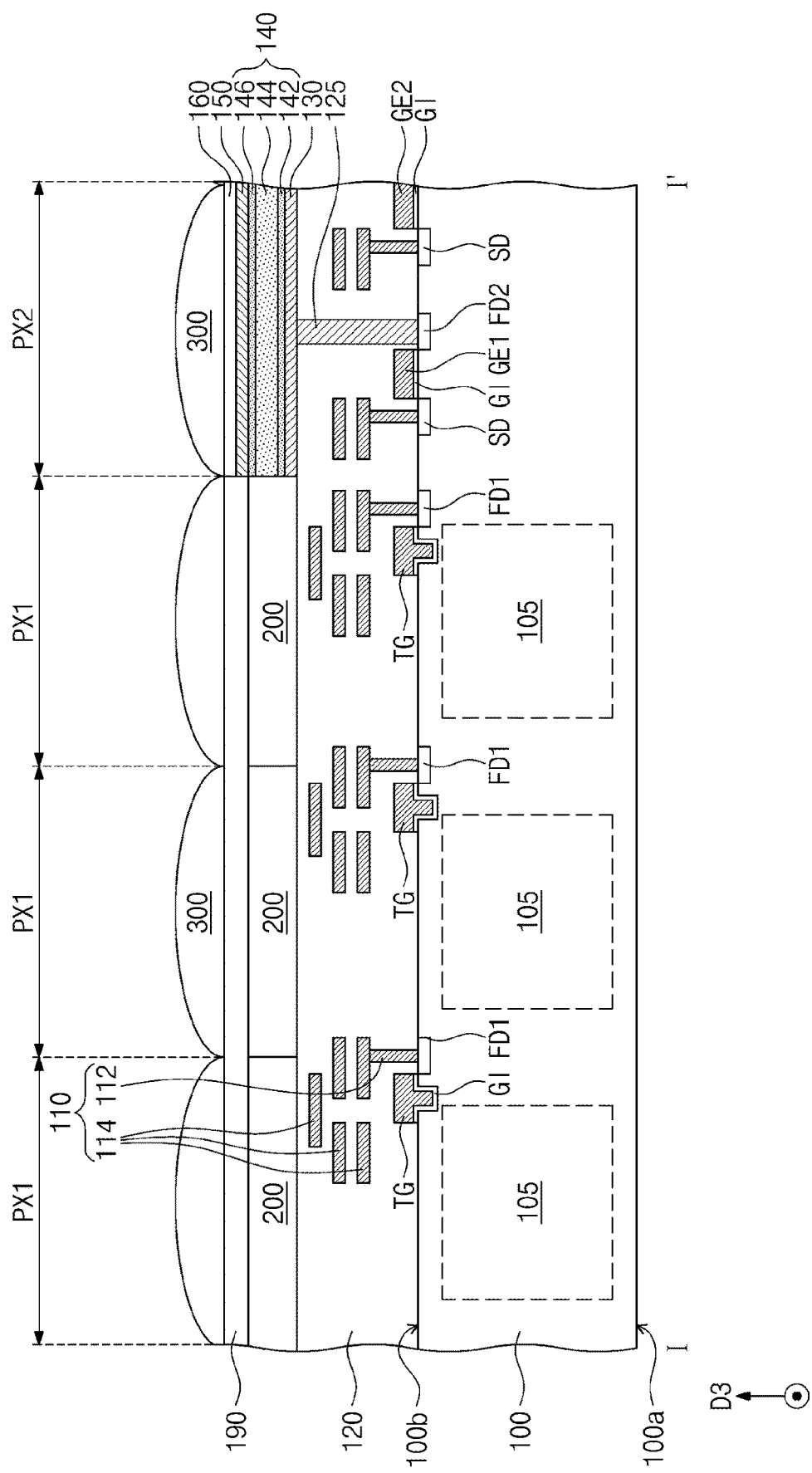
FIG. 10 illustrates an alternative cross-sectional view taken along line I-I' of FIG. 6, showing an image sensor according to some embodiments of the present inventive concepts.

FIG. 10 illustrates a cross-sectional view taken along line I-I' of FIG. 6, showing an image sensor according to some embodiments of the present inventive concepts. For brevity of description, the following will focus on differences from the image sensor discussed with reference to FIGS. 6 and 7.

Referring to FIGS. 6 and 10, each of the first pixels PX1 may include a transfer gate electrode TG on the second surface 100b of the substrate 100, a gate dielectric pattern GI between the substrate 100 and the transfer gate electrode TG, and a first floating diffusion region FD1 disposed adjacent to the second surface 100b of the substrate 100. Except that the transfer gate electrode TG, the gate dielectric pattern GI, and the first floating diffusion region FD1 are disposed on the second surface 100b of the substrate 100, the transfer gate electrode TG, the gate dielectric pattern GI, and the first floating diffusion region FD1 may be substantially the same as the transfer gate electrode TG, the gate dielectric pattern GI, and the first floating diffusion region FD1 that are discussed with reference to FIGS. 6 and 7.

Each of the first pixels PX1 may further include wiring patterns 110 on the second surface 100b of the substrate 100. The wiring patterns 110 may include conductive contacts 112 and conductive lines 114 connected to the conductive contacts 112. Except that the wiring patterns 110 are disposed on the second surface 100b of the substrate 100, the wiring patterns 110 may be substantially the same as the wiring patterns 110 discussed with reference to FIGS. 6 and 7. Each of the first pixels PX1 may further include an interlayer dielectric layer 120 that is disposed on the second surface 100b of the substrate 100 and that covers the transfer gate electrode TG and the wiring patterns 110. Except that the interlayer dielectric layer 120 is disposed on the second surface 100b of the substrate 100, the interlayer dielectric layer 120 may be substantially the same as the interlayer dielectric layer 120 discussed with reference to FIGS. 6 and 7.

Each of the first pixels PX1 may further include a color filter 200, an upper dielectric layer 190, and a microlens 300 that are sequentially disposed on the second surface 100b of the substrate 100. The color filter 200, the upper dielectric layer 190, and the microlens 300 may be sequentially stacked on the interlayer dielectric layer 120. The wiring patterns 110 and the interlayer dielectric layer 120 may be disposed between the color filter 200 and the second surface 100b of the substrate 100. The color filter 200, the upper dielectric layer 190, and the microlens 300 may be substantially the same as the color filter 200, the upper dielectric layer 190, and the microlens 300 that are discussed with reference to FIGS. 6 and 7.

The second pixel PX2 may include source/drain regions SD and a second floating diffusion region FD2 that are disposed adjacent to the second surface 100b of the substrate 100. Except that the source/drain regions SD and the second floating diffusion region FD2 are disposed adjacent to the second surface 100b of the substrate 100, the source/drain regions SD and the second floating diffusion region FD2 may be substantially the same as the source/drain region SD and the second floating diffusion region FD2 that are discussed with reference to FIGS. 6 and 7.

The second pixel PX2 may further include gate electrodes GE1 and GE2 disposed on the second surface 100b of the substrate 100, and may also further include gate dielectric patterns GI between the second surface 100b of the substrate 100 and the gate electrodes GE1 and GE2. A first gate electrode GE1 of the gate electrodes GE1 and GE2 may be disposed between the second floating diffusion region FD2 and one of the source/drain regions SD, and a second gate electrode GE2 of the gate electrodes GE1 and GE2 may be disposed between corresponding ones of the source/drain regions SD. The first gate electrode GE1, the one of the source/drain regions SD, and the second floating diffusion region FD2 may constitute the second reset transistor RX2 discussed with reference to FIG. 5, and the first gate electrode GE1 may correspond to the second reset gate RG2 discussed with reference to FIG. 5. The second gate electrode GE2 and the corresponding source/drain regions SD may constitute one of the second selection transistor SX2 and the second drive transistor DX2 that are discussed with reference to FIG. 5. When the second gate electrode GE2 and the corresponding source/drain regions SD constitute the second selection transistor SX2, the second gate electrode GE2 may correspond to the selection gate SG discussed with reference to FIG. 5.

The second pixel PX2 may further include the wiring patterns 110 and the interlayer dielectric layer 120 on the second surface 100b of the substrate 100. Each of the source/drain regions SD may be electrically connected through a corresponding one of the conductive contacts 112 to a corresponding one of the conductive lines 114.

The second pixel PX2 may further include a vertical electrode 125 that penetrates the interlayer dielectric layer 120. The vertical electrode 125 may be electrically connected to the second floating diffusion region FD2 and may penetrate along the third direction D3 through the interlayer dielectric layer 120.

The second pixel PX2 may further include a pixel electrode 130, a photoelectric conversion layer 140, a transparent electrode 150, and a protection layer 160 that are sequentially stacked on the second surface 100b of the substrate 100 and on the interlayer dielectric layer 120. The pixel electrode 130, the photoelectric conversion layer 140, the transparent electrode 150, and the protection layer 160 may be substantially the same as the pixel electrode 130, the photoelectric conversion layer 140, the transparent electrode 150, and the protection layer 160 that are discussed with respect to FIGS. 6 and 7.

The pixel electrode 130, the photoelectric conversion layer 140, the transparent electrode 150, and the protection layer 160 of the second pixel PX2 may be disposed on one side of the color filter 200 of each of the first pixels PX1 and on one side of the upper dielectric layer 190. The color filter 200 and the upper dielectric layer 190 may cover lateral surfaces of the pixel electrode 130, the photoelectric conversion layer 140, the transparent electrode 150, and the protection layer 160 of the second pixel PX2. The second pixel PX2 may further include the microlens 300 on the protection layer 160. Except as discussed above, an image sensor according to the present embodiment may be substantially the same as the image sensor discussed with reference to FIGS. 6 and 7.

Figure 11:
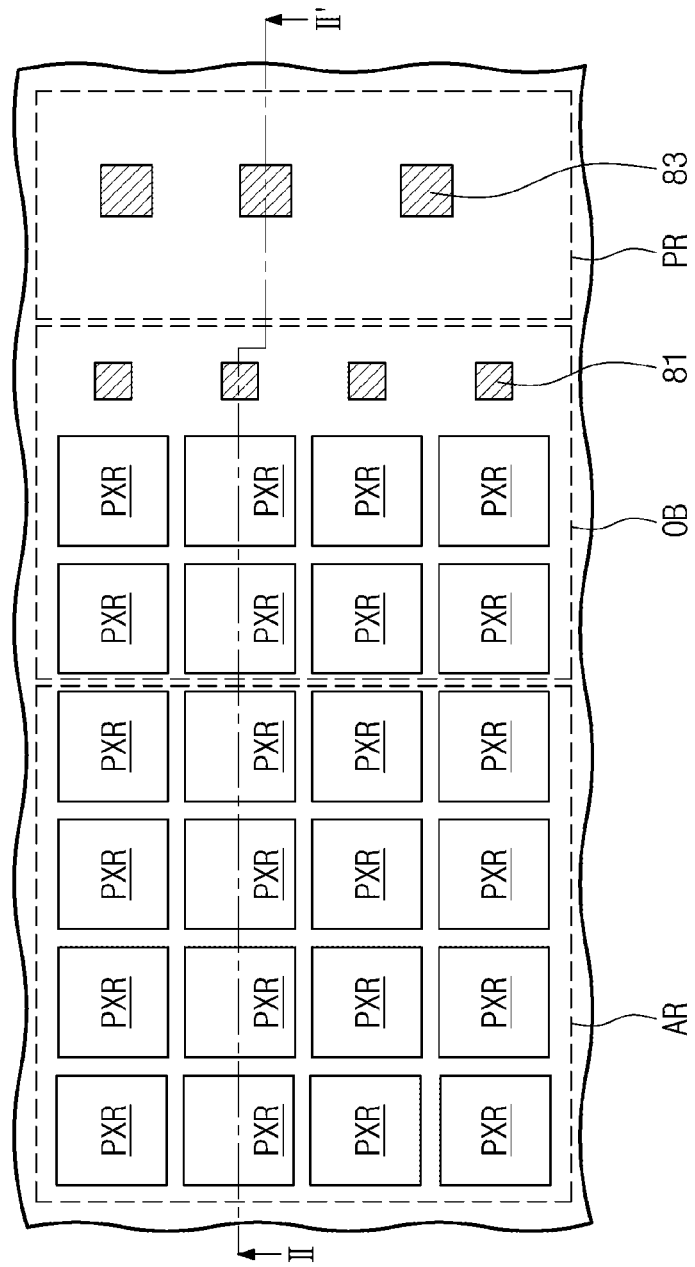
FIG. 11 illustrates a plan layout view showing an image sensor according to some embodiments of the present inventive concepts.
Figure 12:
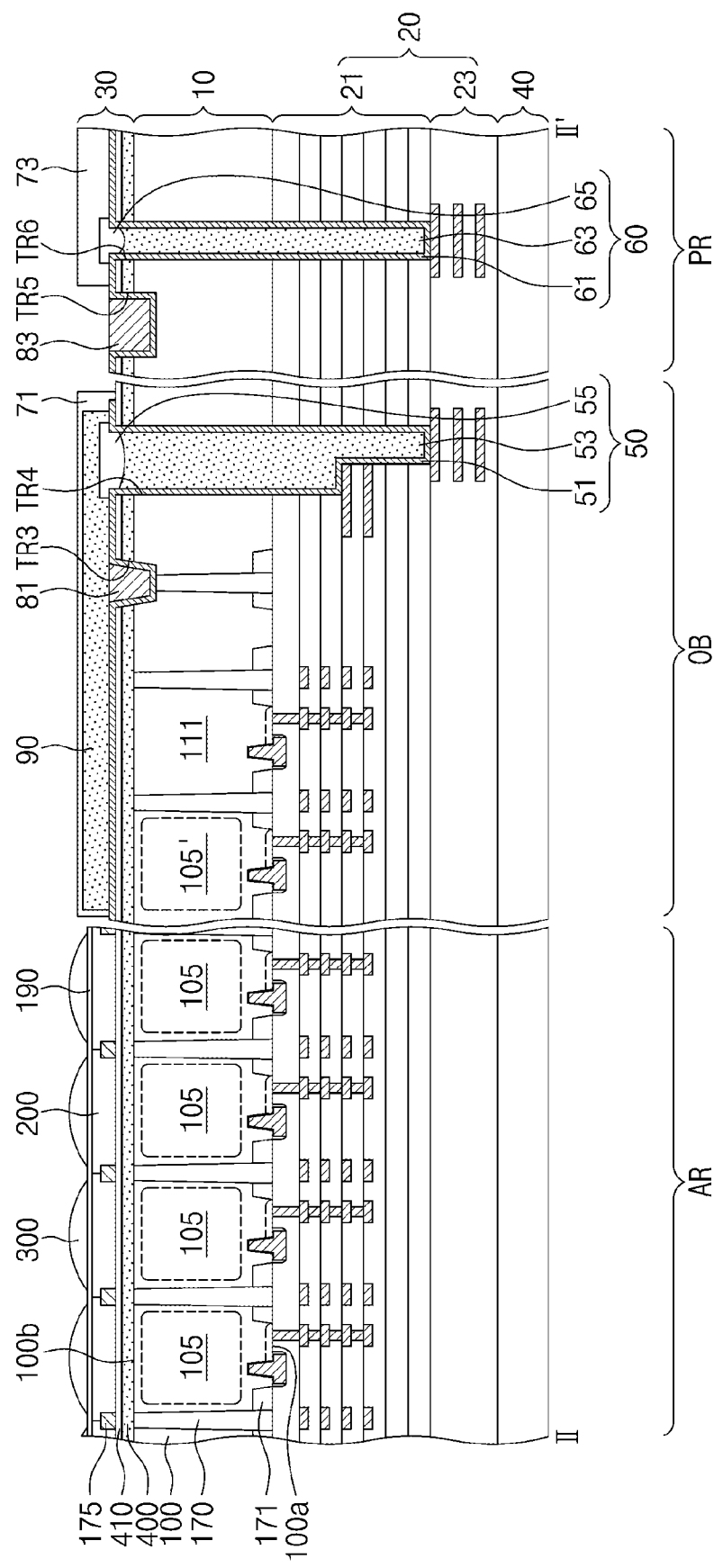
FIG. 12 illustrates a cross-sectional view taken along line II-II' of FIG. 11.

FIG. 11 illustrates a plan view showing an image sensor according to some embodiments of the present inventive concepts. FIG. 12 illustrates a cross-sectional view taken along line II-II' of FIG. 11. For brevity of description, the following will focus on differences from the image sensor discussed with reference to FIGS. 1 to 10.

Referring to FIGS. 11 and 12, an image sensor may include a substrate 100 including a pixel array area AR, an optical black area OB, and a pad area PR, a wiring layer 20 on a first surface 100a of the substrate 100, a base substrate 40 on the wiring layer 20, and an optical transmission layer 30 on a second surface 100b of the substrate 100. The wiring layer 20 may be disposed between the base substrate 40 and a first surface 100a of the substrate 100. The wiring layer 20 may include an upper wiring layer 21 adjacent to the first surface 100a of the substrate 100, and may also include a lower wiring layer 23 between the upper wiring layer 21 and the base substrate 40. The pixel array area AR may include a plurality of pixel regions PXR and a deep isolation pattern 170 disposed between the plurality of pixel regions PXR. The pixel array area AR may further include an antireflection layer 400 and a dielectric layer 410 on a second surface 100b of the substrate 100. The antireflection layer 400 and the dielectric layer 410 may be disposed between a grid pattern 175 and the second surface 100b of the substrate 100. The pixel array area AR may be configured substantially identical to the image sensor discussed with reference to FIGS. 1 to 10.

A first connection structure 50, a first contact 81, and a bulk color filter 90 may be disposed on the optical black area OB of the substrate 100. The first connection structure 50 may include a first light-shield pattern 51, a first separation pattern 53, and a first capping pattern 55. The first light-shield pattern 51 may be disposed on the second surface 100b of the substrate 100. The first light-shield pattern 51 may cover the dielectric layer 410, and may conformally cover an inner wall of third and fourth trenches TR3 and TR4. The first light-shield pattern 51 may penetrate a photoelectric conversion layer 10 and the upper wiring layer 21. The first light-shield pattern 51 may be connected to the semiconductor pattern 176 and 177 of the deep isolation pattern 170 included in the photoelectric conversion layer 10, and may be connected to wiring lines in the upper wiring layer 21 and the lower wiring layer 23. Therefore, the first connection structure 50 may electrically connect the photoelectric conversion layer 10 to the wiring layer 20. The first light-shield pattern 51 may include a metallic material (e.g., tungsten). The first light-shield pattern 51 may block light that is incident on the optical black area OB.

The first contact 81 may fill an unoccupied portion the third trench TR3. The first contact 81 may include a metallic material (e.g., aluminum). The first contact 81 may be connected to the semiconductor pattern 176 and 177 of the deep isolation pattern 170. A bias may be applied through the first contact 81 to the semiconductor pattern 176 and 177. The first separation pattern 53 may fill an unoccupied portion of the fourth trench TR4. The first separation pattern 53 may penetrate the photoelectric conversion layer 10 and a portion of the wiring layer 20. The first separation pattern 53 may include a dielectric material. The first capping pattern 55 may be disposed on the first separation pattern 53. The first capping pattern 55 may include the same material as that of the buried dielectric pattern 179 included in the deep isolation pattern 170.

The bulk color filter 90 may be disposed on the first connection structure 50 and the first contact 81. The bulk color filter 90 may cover the first connection structure 50 and the first contact 81. A first protection layer 71 may lie on and encapsulate the bulk color filter 90.

An additional photoelectric conversion region 105' and a dummy region 111 may each be provided in a corresponding pixel region PXR of the optical black area OB. The additional photoelectric conversion region 105' may be a zone doped with impurities having a second conductivity type (e.g., n-type) different from a first conductivity type of the substrate 100. The additional photoelectric conversion region 105' may have a structure similar to that of the photoelectric conversion regions 105 in the plurality of pixel regions PXR of the pixel array area AR, but may not perform the same operation (e.g., reception of light and generation of electrical signals) as that of the photoelectric conversion regions 105. The dummy region 111 may not be doped with impurities.

A second connection structure 60, a second contact 83, and a second protection layer 73 may be disposed on the pad area PR of the substrate 100. The second connection structure 60 may include a second light-shield pattern 61, a second separation pattern 63, and a second capping pattern 65.

The second light-shield pattern 61 may be disposed on the second surface 100b of the substrate 100. The second light-shield pattern 61 may cover the dielectric layer 410, and may conformally cover an inner wall of each of fifth and sixth trenches TR5 and TR6. The second light-shield pattern 61 may penetrate the photoelectric conversion layer 10 and the upper wiring layer 21. The second light-shield pattern 61 may be connected to wiring lines in the lower wiring layer 23. Therefore, the second connection structure 60 may electrically connect the photoelectric conversion layer 10 to the wiring layer 20. The second light-shield pattern 61 may include a metallic material (e.g., tungsten). The second light-shield pattern 61 may block light that is incident on the pad area PR.

The second contact 83 may fill an unoccupied portion of the fifth trench TR5. The second contact 83 may include a metallic material (e.g., aluminum). The second contact 83 may serve as an electrical connection path between the image sensor and an external device. The second separation pattern 63 may fill an unoccupied portion of the sixth trench TR6. The second separation pattern 63 may penetrate the photoelectric conversion layer 10 and a portion of the wiring layer 20. The second separation pattern 63 may include a dielectric material. The second capping pattern 65 may be disposed on the second separation pattern 63. The second capping pattern 65 may include the same material as that of the buried dielectric pattern 179 included in the deep isolation pattern 170. The second protection layer 73 may cover the second connection structure 60.

A current applied via the second contact 83 may flow toward the semiconductor pattern 176 and 177 of the deep isolation pattern 170 through the second light-shield pattern 61, wiring lines in the wiring layer 20, and the first light-shield pattern 51. Electrical signals generated from the photoelectric conversion regions 105 in the plurality of pixel regions PXR of the pixel array area AR may be externally transferred through wiring lines in the wiring layer 20, the second light-shield pattern 61, and the second contact 83.

According to the present inventive concepts, it may be possible to provide an image sensor that includes pixels having increased efficiency for detecting short-wave infrared radiation. In addition, an image sensor may be provided in which first pixels that detect visible light and a second pixel that detects short-wave infrared radiation are horizontally arranged on the same substrate.

The aforementioned description provides some embodiments for explaining the present inventive concepts. Therefore, the present inventive concepts are not limited to the embodiments described above, and it will be understood by one of ordinary skill in the art that variations in form and detail may be made therein without departing from the spirit and essential features of the present inventive concepts.

What is claimed is:

1. An image sensor, comprising:
   a substrate having first and second opposing surfaces thereon;
   a first pixel comprising a first color filter on the second surface of the substrate, and a first photoelectric conversion region within a first portion of the substrate, which extends between the first and second opposing surfaces of the substrate and extends between the first color filter and the first surface of the substrate; and
   a second pixel having different light receiving characteristics relative to the first pixel, said second pixel comprising:
   a pixel electrode on the second surface of the substrate; and
   a photoelectric conversion layer comprising a perovskite material, on the pixel electrode; and
   wherein a color filter is omitted from a light receiving path of the second pixel.

2. The image sensor of claim 1,
   wherein the substrate comprises a semiconductor material of first conductivity type;
   wherein the first photoelectric conversion region comprises a semiconductor material of second conductivity type, which forms a P-N junction photodiode with the substrate; and
   wherein the second pixel comprises a transparent electrode on the photoelectric conversion layer.

3. The image sensor of claim 2, wherein the second pixel further comprises a vertical electrode, which is electrically connected to the pixel electrode and extends at least partially through the substrate; and wherein the pixel electrode, the photoelectric conversion layer and the transparent electrode are vertically stacked in a direction orthogonal to the second surface of the substrate.

4. The image sensor of claim 3, wherein the second pixel further comprises a floating diffusion region within the substrate, which is electrically connected to the vertical electrode.

5. The image sensor of claim 4, wherein the floating diffusion region of the second pixel extends adjacent the first surface of the substrate.

6. The image sensor of claim 1, further comprising a microlens array on the second surface of the substrate; and wherein the pixel electrode, the photoelectric conversion layer and the transparent electrode of the second pixel extend between a corresponding microlens within the microlens array and the second surface of the substrate.

7. The image sensor of claim 6, wherein the photoelectric conversion layer comprises a perovskite layer, a first blocking layer extending between the pixel electrode and the perovskite layer, and a second blocking layer extending between the transparent electrode and the perovskite layer.

8. The image sensor of claim 7, wherein the first blocking layer comprises a material that induces a first potential barrier at a first interface between the first blocking layer and the perovskite layer, which preferentially blocks electrons generated within the perovskite layer from transferring across the first interface; and wherein the second blocking layer comprises a material that induces a second potential barrier at a second interface between the second blocking layer and the perovskite layer, which preferentially blocks holes generated within the perovskite layer from transferring across the second interface.

9. The image sensor of claim 7, wherein the first blocking layer includes at least one material selected from a group consisting of NiO, MoO$_3$, and V$_2$O$_5$; and wherein the second blocking layer includes at least one material selected from a group consisting of TiO$_2$, HfO$_2$, SnO$_2$, and ZnO.

10. The image sensor of claim 9, wherein the perovskite material has a material structure of ABX$_3$, A$_2$BX$_4$, A$_3$BX$_5$, A$_4$BX$_6$, ABX$_4$, or A$_{n-1}$BnX$_{3n+1}$ (where n is a positive integer in a range from 2 to 6); wherein A includes at least one material selected from a group consisting of Na, K, Rb, Cs and Fr; wherein B includes at least one material selected from a divalent transition metal, a rare earth metal, an alkaline earth metal, Ga, In, Al, Sb, Bi, and Po; and wherein X includes at least one material selected from Cl, Br, and I.

11. The image sensor of claim 1, wherein the perovskite material has a material structure of ABX$_3$, A$_2$BX$_4$, A$_3$BX$_5$, A$_4$BX$_6$, ABX$_4$, or A$_{n-1}$BnX$_{3n+1}$ (where n is a positive integer in a range from 2 to 6); wherein A includes at least one material selected from a group consisting of Na, K, Rb, Cs and Fr; wherein B includes at least one material selected from a divalent transition metal, a rare earth metal, an alkaline earth metal, Ga, In, Al, Sb, Bi, and Po; and wherein X includes at least one material selected from Cl, Br, and I.

12. An image sensor pixel array, comprising:
a substrate having a pixel electrode of an infrared pixel on a light receiving surface thereof;
a photoelectric conversion layer comprising a perovskite material, on the pixel electrode of the infrared pixel; and
a color pixel extending adjacent the infrared pixel, said color pixel comprising:
a semiconductor photoelectric conversion region within the substrate; and
a color filter layer, which extends on the light receiving surface and opposite the semiconductor photoelectric conversion region; and
wherein a color filter is omitted from the photoelectric conversion layer and an infrared light receiving path of the infrared pixel.

13. The image sensor pixel array of claim 12, further comprising:
a transparent electrode on the photoelectric conversion layer; and
a vertical electrode, which is electrically connected to the pixel electrode and extends at least partially through the substrate.

14. The image sensor pixel array of claim 13, further comprising a floating diffusion region within the substrate, which is electrically connected to the vertical electrode.

15. The image sensor pixel array of claim 13, wherein the photoelectric conversion layer comprises a perovskite layer, a first blocking layer extending between the pixel electrode and the perovskite layer, and a second blocking layer extending between the transparent electrode and the perovskite layer.

16. The image sensor pixel array of claim 15, wherein the first blocking layer comprises a material that induces a first potential barrier at a first interface between the first blocking layer and the perovskite layer, which preferentially blocks electrons generated within the perovskite layer from transferring across the first interface; and wherein the second blocking layer comprises a material that induces a second potential barrier at a second interface between the second blocking layer and the perovskite layer, which preferentially blocks holes generated within the perovskite layer from transferring across the second interface.

17. The image sensor pixel array of claim 15, wherein the first blocking layer includes at least one material selected from a group consisting of NiO, MoO$_3$, and V$_2$O$_5$; and wherein the second blocking layer includes at least one material selected from a group consisting of TiO$_2$, HfO$_2$, SnO$_2$, and ZnO.

18. The image sensor pixel array of claim 12, wherein the perovskite material has a material structure of ABX$_3$, A$_2$BX$_4$, A$_3$BX$_5$, A$_4$BX$_6$, ABX$_4$, or A$_{n-1}$BnX$_{3n+1}$ (where n is a positive integer in a range from 2 to 6); wherein A includes at least one material selected from a group consisting of Na, K, Rb, Cs and Fr; wherein B includes at least one material selected from a divalent transition metal, a rare earth metal, an alkaline earth metal, Ga, In, Al, Sb, Bi, and Po; and wherein X includes at least one material selected from Cl, Br, and I.

19. An image sensor, comprising:
a substrate having first and second opposing surfaces thereon and comprising a semiconductor material of first conductivity type;
a microlens array on the second surface of the substrate;
a first pixel comprising a first color filter on the second surface of the substrate, and a first photoelectric conversion region within a first portion of the substrate, which extends between the first and second opposing surfaces of the substrate and extends between the first color filter and the first surface of the substrate; and
a second pixel having different light receiving characteristics relative to the first pixel, said second pixel comprising:
a pixel electrode on the second surface of the substrate;
a photoelectric conversion layer comprising a perovskite material, on the pixel electrode; and
a transparent electrode on the photoelectric conversion layer;
wherein a color filter is omitted from a light receiving path of the second pixel;
wherein the first photoelectric conversion region comprises a semiconductor material of second conductivity type, which forms a P-N junction photodiode with the substrate; and
wherein the pixel electrode, the photoelectric conversion layer and the transparent electrode of the second pixel extend between a corresponding microlens within the microlens array and the second surface of the substrate.

* * * * *